(12) United States Patent
Ikeda et al.

(10) Patent No.: US 8,507,903 B2
(45) Date of Patent: Aug. 13, 2013

(54) LIGHT-EMITTING DEVICE AND METHOD FOR MANUFACTURING THE SAME

(75) Inventors: Hisao Ikeda, Atsugi (JP); Junichiro Sakata, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/478,547

(22) Filed: May 23, 2012

(65) Prior Publication Data

US 2012/0241812 A1   Sep. 27, 2012

Related U.S. Application Data

(60) Division of application No. 12/767,902, filed on Apr. 27, 2010, now Pat. No. 8,216,875, and a continuation of application No. 10/571,891, filed as application No. PCT/JP2004/014412 on Sep. 24, 2004, now Pat. No. 7,732,808.

(30) Foreign Application Priority Data

Sep. 26, 2003  (JP) ................................. 2003-336295

(51) Int. Cl.
  *H01L 35/24*  (2006.01)
(52) U.S. Cl.
  USPC ..................................... 257/40; 257/E51.001
(58) Field of Classification Search
  USPC .......................................... 257/40, E51.001
  See application file for complete search history.

(56) References Cited

U.S. PATENT DOCUMENTS

| | | | |
|---|---|---|---|
| 5,404,075 A | 4/1995 | Fujikawa et al. |
| 5,487,953 A | 1/1996 | Shirota et al. |
| 5,540,999 A | 7/1996 | Yamamoto et al. |
| 5,989,737 A | 11/1999 | Xie et al. |

(Continued)

FOREIGN PATENT DOCUMENTS

| | | |
|---|---|---|
| CN | 1327360 | 12/2001 |
| EP | 0 520 779 | 12/1992 |

(Continued)

OTHER PUBLICATIONS

T. Nakada et al., "Multi Photon Emission Organic EL Devices Using Charge-Transfer Complex as Charge Generation Layer," The 63$^{rd}$ Autumn Meeting, 2002, vol. 27a-ZL-12, p. 1165.

(Continued)

*Primary Examiner* — Anthony Ho
(74) *Attorney, Agent, or Firm* — Eric J. Robinson; Robinson Intellectual Property Law Office, P.C.

(57) ABSTRACT

A light-emitting element is disclosed that can drive at a low driving voltage and that has a longer lifetime than the conventional light-emitting element, and a method is disclosed for manufacturing the light-emitting element. The disclosed light-emitting element includes a plurality of layers between a pair of electrodes; and at least one layer among the plurality of layers contains one compound selected from the group consisting of oxide semiconductor and a metal oxide, and a compound having high hole transportation properties. Such the light-emitting element can suppress the crystallization of a layer containing one compound selected from the group consisting of oxide semiconductor and a metal oxide, and a compound having high hole transportation properties. As a result, a lifetime of the light-emitting element can be extended.

16 Claims, 15 Drawing Sheets

(56) References Cited

U.S. PATENT DOCUMENTS

| | | | |
|---|---|---|---|
| 6,013,384 | A | 1/2000 | Kido et al. |
| 6,084,176 | A | 7/2000 | Shiratsuchi et al. |
| 6,380,687 | B1 | 4/2002 | Yamazaki |
| 6,423,429 | B2 | 7/2002 | Kido et al. |
| 6,483,236 | B1 | 11/2002 | Hung |
| 6,486,601 | B1 | 11/2002 | Sakai et al. |
| 6,489,638 | B2 | 12/2002 | Seo et al. |
| 6,518,700 | B1 | 2/2003 | Friend et al. |
| 6,552,496 | B2 | 4/2003 | Yamazaki |
| 6,573,650 | B2 | 6/2003 | Aoki et al. |
| 6,589,673 | B1 | 7/2003 | Kido et al. |
| 6,593,691 | B2 | 7/2003 | Nishi et al. |
| 6,608,449 | B2 | 8/2003 | Fukunaga |
| 6,617,788 | B2 | 9/2003 | Shiiki et al. |
| 6,642,544 | B1 | 11/2003 | Hamada et al. |
| 6,650,047 | B2 | 11/2003 | Aoki et al. |
| 6,660,186 | B2 | 12/2003 | Ravilisetty |
| 6,690,033 | B2 | 2/2004 | Yamazaki et al. |
| 6,692,845 | B2 | 2/2004 | Maruyama et al. |
| 6,774,573 | B2 | 8/2004 | Yamazaki |
| 6,794,278 | B2 | 9/2004 | Kido et al. |
| 6,830,494 | B1 | 12/2004 | Yamazaki et al. |
| 6,831,408 | B2 | 12/2004 | Hirano et al. |
| 7,074,500 | B2 | 7/2006 | Pfeiffer et al. |
| 7,141,817 | B2 | 11/2006 | Nishi et al. |
| 7,158,161 | B2 | 1/2007 | Gyoutoku et al. |
| 7,256,422 | B2 | 8/2007 | Yamazaki |
| 7,323,225 | B2 | 1/2008 | Aoki et al. |
| 7,572,522 | B2 | 8/2009 | Seo et al. |
| 7,579,089 | B2 | 8/2009 | Seo et al. |
| 2001/0053559 | A1 | 12/2001 | Nagao et al. |
| 2002/0086180 | A1 | 7/2002 | Seo et al. |
| 2003/0030059 | A1 | 2/2003 | Shi et al. |
| 2003/0048072 | A1 | 3/2003 | Ishihara et al. |
| 2003/0160260 | A1 | 8/2003 | Hirai et al. |
| 2003/0189401 | A1 | 10/2003 | Kido et al. |
| 2003/0218418 | A9 | 11/2003 | Sato et al. |
| 2004/0140758 | A1 | 7/2004 | Raychaudhuri et al. |
| 2005/0035708 | A1 | 2/2005 | Yamazaki et al. |
| 2005/0084712 | A1 | 4/2005 | Kido et al. |
| 2005/0084713 | A1 | 4/2005 | Kido et al. |
| 2005/0098207 | A1 | 5/2005 | Matsumoto et al. |
| 2005/0106419 | A1 | 5/2005 | Endoh et al. |
| 2005/0170208 | A1 | 8/2005 | Yatsunami et al. |
| 2006/0008740 | A1 | 1/2006 | Kido et al. |
| 2007/0182317 | A1 | 8/2007 | Kido et al. |
| 2008/0191611 | A1 | 8/2008 | Iwaki et al. |
| 2009/0273280 | A1 | 11/2009 | Seo et al. |
| 2010/0096627 | A1 | 4/2010 | Ikeda et al. |

FOREIGN PATENT DOCUMENTS

| | | |
|---|---|---|
| EP | 0 855 848 | 7/1998 |
| EP | 0 948 063 | 10/1999 |
| EP | 1 009 198 | 6/2000 |
| EP | 1 065 723 | 1/2001 |
| EP | 1 089 361 | 4/2001 |
| EP | 1 093 167 | 4/2001 |
| EP | 1 128 438 | 8/2001 |
| EP | 1 160 891 | 12/2001 |
| EP | 1 220 340 | 7/2002 |
| EP | 1 261 042 | 11/2002 |
| EP | 1 351 558 | 10/2003 |
| EP | 1 524 706 | 4/2005 |
| EP | 1 524 707 | 4/2005 |
| EP | 1 530 245 | 5/2005 |
| EP | 1 617 493 | 1/2006 |
| EP | 2 256 840 | 12/2010 |
| JP | 61-202420 | 9/1986 |
| JP | 01-312873 | 12/1989 |
| JP | 02-139892 | 5/1990 |
| JP | 03-114197 | 5/1991 |
| JP | 03-190088 | 8/1991 |
| JP | 03-274695 | 12/1991 |
| JP | 04-357694 | 12/1992 |
| JP | 05-182766 | 7/1993 |
| JP | 05-271118 | 10/1993 |
| JP | 06-267658 | 9/1994 |
| JP | 06-290873 | 10/1994 |
| JP | 07-312289 | 11/1995 |
| JP | 08-288069 | 11/1996 |
| JP | 09-063771 | 3/1997 |
| JP | 10-199681 | 7/1998 |
| JP | 10-255985 | 9/1998 |
| JP | 10-270171 | 10/1998 |
| JP | 10-308284 | 11/1998 |
| JP | 2824411 | 11/1998 |
| JP | 11-251067 | 9/1999 |
| JP | 11-297474 | 10/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2001-043980 | 2/2001 |
| JP | 2001-076868 | 3/2001 |
| JP | 2001-185354 | 7/2001 |
| JP | 2001-244079 | 9/2001 |
| JP | 2002-015873 | 1/2002 |
| JP | 2002-313583 | 10/2002 |
| JP | 2002-332567 | 11/2002 |
| JP | 2002-367784 | 12/2002 |
| JP | 2003-217857 | 7/2003 |
| JP | 2003-229278 | 8/2003 |
| JP | 2003-252888 | 9/2003 |
| JP | 2003-264082 | 9/2003 |
| JP | 2003-267976 | 9/2003 |
| JP | 2003-272835 A | 9/2003 |
| JP | 2003-272860 | 9/2003 |
| JP | 2004-055177 | 2/2004 |
| JP | 2004-134395 | 4/2004 |
| JP | 2004-514257 | 5/2004 |
| JP | 2004-349007 | 12/2004 |
| JP | 2005-026121 | 1/2005 |
| JP | 2005-032618 | 2/2005 |
| JP | 2005-123094 | 5/2005 |
| JP | 2005-123095 | 5/2005 |
| JP | 2005-166637 | 6/2005 |
| JP | 2005-251587 | 9/2005 |
| JP | 2006-024791 | 1/2006 |
| TW | 200306762 | 11/2003 |
| WO | WO 00/01203 | 1/2000 |
| WO | WO 02/41414 | 5/2002 |
| WO | WO 2005/006460 | 1/2005 |

OTHER PUBLICATIONS

S. Tokito et al., "Metal Oxides as a Hole-Injecting Layer for an Organic Electroluminescent Device," Journal of Applied Physics, 1996, vol. 29, pp. 2750-2753.

International Search Report (Application No. PCT/JP2004/014412) dated Mar. 22, 2005.

Written Opinion (Application No. PCT/JP2004/014412) dated Mar. 22, 2005.

International Search Report (Application No. PCT/JP2004/019466) dated Apr. 12, 2005.

Written Opinion (Application No. PCT/JP2004/019466) dated Apr. 12, 2005.

Office Action (Application No. 200480027991.7) dated Feb. 6, 2009.

J. Kido et al., "27.1: Invited Paper: High Efficiency Organic EL Devices Having Charge Generation Layers," SID Digest '03: SID International Symposium Digest of Technical Papers, 2003, vol. 36, pp. 964-965.

European Search Report (Application No. 04773500.6) dated Jul. 12, 2010.

Office Action (U.S. Appl. No. 10/577,471) dated Dec. 20, 2010.

Chinese Office Action (Application No. 200910266836.5) dated May 9, 2011.

Office Action (U.S. Appl. No. 12/647,743) dated Jul. 6, 2011.

Taiwanese Office Action (Application No. 093129070) dated Oct. 12, 2011.

Notice of Allowance (U.S. Appl. No. 12/647,743) dated Jan. 13, 2012.

Kim, S. H. et al., "Fabrication and Characterization of Metal Oxide Nanoparticles/Hole Transporting Polymer Composites" Polymer Preprints, Japan, 2000, vol. 49, No. 10, pp. 3199-3200 (Sep. 8).

Taiwanese Office Action (Application No. 093129070) dated Feb. 29, 2012.

Taiwanese Office Action (Application No. 096135569) dated Mar. 15, 2012.

Taiwanese Office Action (Application No. 101101392) dated Mar. 15, 2012.

J. Kido et al., "27.1: Invited Paper: High Efficiency Organic EL Devices Having Charge Generation Layers," SID Digest '03: SID International Symposium Digest of Technical Papers, 2003, vol. 34, pp. 964-965.

Taiwanese Office Action (Application No. 096135568) dated Feb. 29, 2012.

Taiwanese Office Action (Application No. 096135568) dated Oct. 11, 2011.

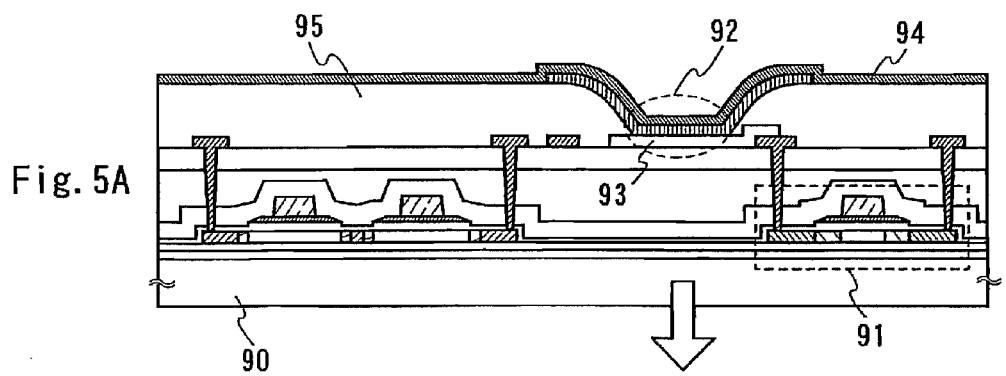
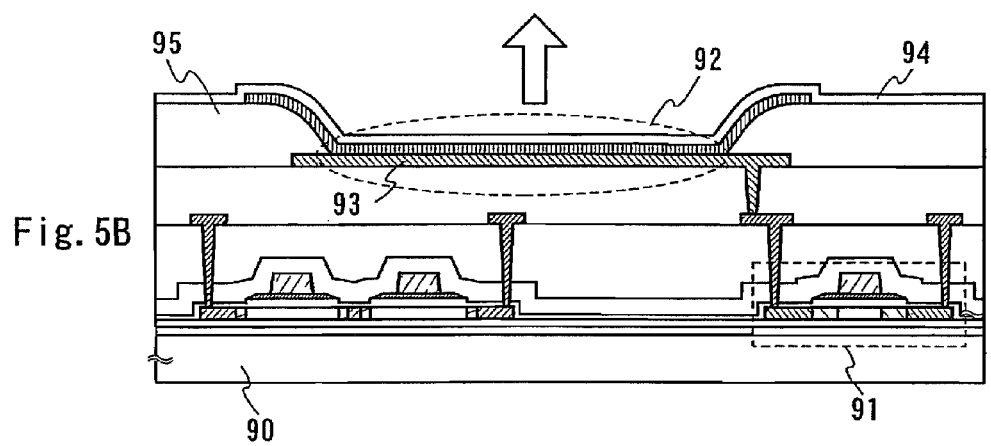
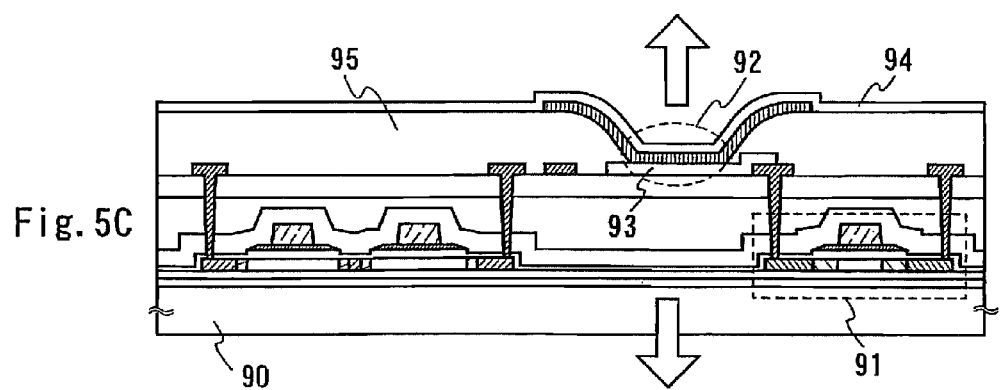

LIGHT-EMITTING DEVICE AND METHOD FOR MANUFACTURING THE SAME

TECHNICAL FIELD

The present invention relates to a light-emitting element formed to have the structure in which a plurality of layers is sandwiched between a pair of electrodes. More specifically, the present invention relates to the structure of a layer, which can be used as at least one layer, within the plurality of layers.

BACKGROUND ART

A light-emitting device utilizing light emission from an electroluminescent element (light-emitting element) has been attracted attention as a display device or a lighting device.

As a light-emitting element used for a light-emitting device, a light-emitting element including a layer containing light-emitting compounds interposed between a pair of electrodes is well known.

Within such a light-emitting element, either of the electrodes serves as an anode, and another serves as a cathode, holes injected from the anode and electrons injected from the cathode are recombined with each other to form molecular exciton, and the molecular exciton radiates energy as light while returning to the ground state.

The demand for low power consumption is especially increased in display devices to be installed in various information processing devices, which have been drastically developed in recent years. In order to achieve low power consumption, it has been attempted to reduce a voltage for driving a light-emitting element. In consideration with commercialization, it is important not only to reduce a voltage for driving a light-emitting element but also extend a lifetime of a light-emitting device. Therefore, a light-emitting device has been developed to achieve low power consumption and a long lifetime.

For example, unexamined patent publication No. 9-63771 discloses that a voltage for driving a light-emitting element is reduced by forming an anode by a metal oxide having a large work function such as a molybdenum oxide. Moreover, a lifetime of the light-emitting element can be extended.

The means for extending a lifetime of a light-emitting element disclosed in the unexamined patent publication No. 9-63771 is insufficient, and so it is required to develop the technique for achieving a further long lifetime.

DISCLOSURE OF INVENTION

It is an object of the present invention to provide a light-emitting element that drives at low voltage and has a longer lifetime than the conventional light-emitting element, and a method for manufacturing the light-emitting element.

According to one aspect of the present invention, a light-emitting element includes a plurality of layers between a pair of electrodes, and at least one layer among the plurality of layers contains a hybrid material (a composite material) including an inorganic compound selected from the group consisting of oxide semiconductor and a metal oxide, and an organic compound having high hole transportation properties.

The plurality of layers is composed of layers formed respectively by a substance having high carrier injection properties, a substance having high carrier transportation properties, and the like, so that a light-emitting region is located away from electrodes.

Such the light-emitting element can suppress crystallization of a layer containing one compound selected from the group consisting of oxide semiconductor and a metal oxide, and a compound having high hole transportation properties. As a result, a lifetime of a light-emitting element can be extended.

As specific examples of the oxide semiconductor and the metal oxide, although not limited to the substances recited herein, a molybdenum oxide (MoOx), a vanadium oxide (VOx), a ruthenium oxide (RuOx), a tungsten oxide (WOx), and the like can be used. Besides, an indium tin oxide (ITO), a zinc oxide (ZnO), and a tin oxide (SnO) can be used. Other substances than the foregoing substances can be used.

As the compound having high hole transportation properties, although not limited to the substances recited herein, 4,4'-bis [N-(1-naphthyl)-N-phenyl-amino]-biphenyl (abbreviated α-NPD), an aromatic amine compound (that is, the one having a bond of benzene ring and nitrogen) such as 4,4'-bis [N-(3-methylphenyl)-N-phenyl-amino]-biphenyl (abbreviated TPD), 4,4',4"-tris(N,N-diphenyl -amino)-triphenylamine (abbreviated TDATA), 4,4',4"-tris[N-(3-methylphenyl)-N-phenyl -amino]-triphenylamine (abbreviated MTDATA) can be used. Other substances than the foregoing substances can be used.

According to one aspect of the present invention, a light-emitting element includes a plurality of layers between a pair of electrodes, and at least one layer among the plurality of layers contains one compound selected from the group consisting of oxide semiconductor and a metal oxide, a compound having high hole transportation properties, and a compound having a high steric hindrance.

As same as the aforementioned light-emitting element, the plurality of layers is composed of layers respectively formed by a substance having high carrier injection properties, a substance having high carrier transportation properties, and the like, so that a light-emitting region is located away from electrodes.

Such the light-emitting element that includes a layer containing one compound selected from the group consisting of oxide semiconductor and a metal oxide, a compound having high hole transportation properties, and a compound having a high steric hindrance can suppress the crystallization of the layer. As a result, a lifetime of a light-emitting element can be extended.

The oxide semiconductor, the metal oxide, and the compound having high hole transportation properties are the same as those mentioned above.

As a compound having a high steric hindrance (that is, the coupound having spatiality contrary to a plane structure), 5, 6, 11, 12-tetraphenyltetracene (abbreviated rubrene) is preferably used. Besides, hexaphenylbenzene diphenylanthracene, t-butylperylene, 9, 10-di(phenyl)anthracene, coumarin 545T, and the like can be used. In addition, dendrimer or the like can be used.

According to the present invention, aggregation of oxide semiconductor or a metal oxide can be suppressed, and crystallization of a layer containing the oxide semiconductor or the metal oxide can be suppressed. By suppression of the crystallization, a leak current can be prevented from generating due to the crystallization. Accordingly, a long-lived light-emitting element can be obtained.

These and other objects, features and advantages of the present invention will become more apparent upon reading of the following detailed description along with the accompanied drawings.

BRIEF DESCRIPTION OF DRAWINGS

FIGS. 5A to 5C are cross-sectional views of a light-emitting element according to certain aspects of the present invention;

BEST MODE FOR CARRYING OUT THE INVENTION

A light-emitting element according to the present invention includes a plurality of layers between a pair of electrodes. The plurality of layers is formed by stacking layers in combination with each other, which is formed respectively by a substance having high carrier injection properties or a substance having high carrier transportation properties, so that a light-emitting region is formed away from the electrodes, that is, carriers are recombined with each other in the region away from the electrodes.

Figure 2:
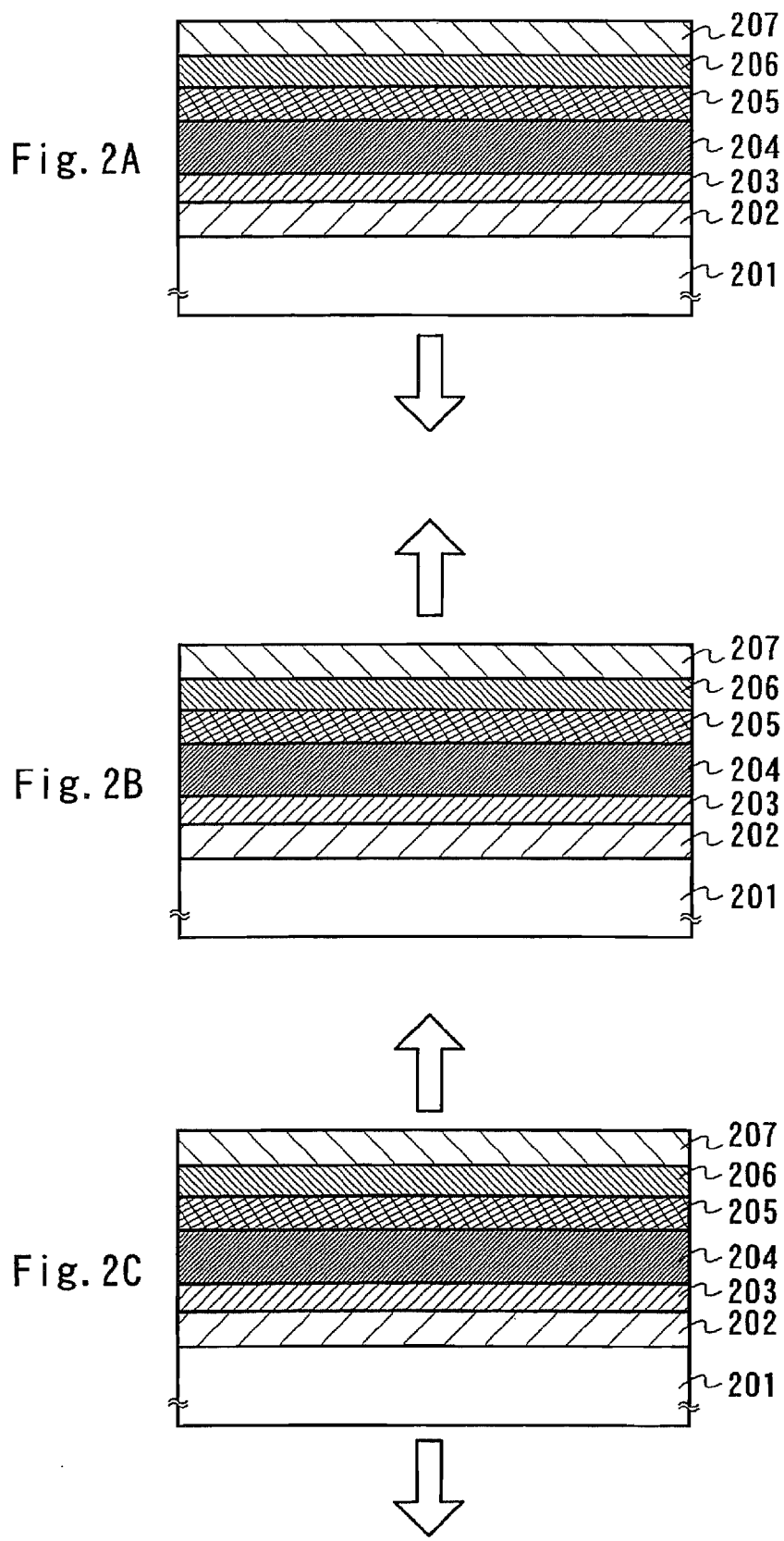
FIGS. 2A to 2C are explanatory cross-sectional views of a light-emitting element according to certain aspects of the present invention.

One mode of a light-emitting element according to the present invention is explained with reference to FIG. 2A.

In this embodiment, a light-emitting element 210 is formed over a substrate 201 used for supporting the light-emitting element 210, and is composed of sequentially a first electrode 202, a first layer 203, a second layer 204, a third layer 205, a fourth layer 206, and a second electrode 207. Further, the first electrode 202 serves as an anode, and the second electrode 207 serves as a cathode in this embodiment.

As the substrate 201, for example, glass or plastic can be used. Another material can be used for the substrate as long as it serves as a support medium for the light-emitting element during a manufacturing process.

The first electrode 202 is preferably formed by a metal having a large work function (at least 4.0 eV), an alloy, an electric conductive compound, or a mixture of the foregoing materials. Specifically, an indium tin oxide (ITO), an indium tin oxide containing silicon, an indium zinc oxide, that is, an indium oxide mixed with zinc oxide of from 2 to 20% (ZnO), aurum (Au), platinum (Pt), nickel (Ni), tungsten (W), chromium (Cu), molybdenum (Mo), ferrum (Fe), cobalt (Co), copper (Cu), palladium (Pd), or a nitride of a metal material (UN), or the like can be used.

The first layer 203 is a layer containing a compound selected from the group consisting of oxide semiconductor and a metal oxide, and a compound having high hole transportation properties. As specific examples of the oxide semiconductor and the metal oxide, although not limited to the substances recited herein, a molybdenum oxide (MoOx), a vanadium oxide (VOx), a ruthenium oxide (RuOx), a tungsten oxide (WOx), and the like can be used. Other substances than the foregoing substances can be used. As a compound having high hole transportation properties, for example, an aromatic amine compound (that is, the one having a bond of a benzene ring and nitrogen) such as 4,4'-bis[N-(1-naphthyl)-N-phenyl-aminol-biphenyl (abbreviated α-NPD), 4,4'-bis[N-(3-methylphenyl)-N -phenyl-amino]-biphenyl (abbreviated TPD), 4,4',4"-tris(N,N-diphenyl-amino)-triphenylamine (abbreviated TDATA), 4,4',4"-tris[N-(3-methylphenyl)-N-phenyl-amino]-triphenylamine (abbreviated MTDATA) can be used. The foregoing substances are mainly the substances having hole mobility of $10^{-6}$ cm²/Vs or more. Another substance can be used as long as it has higher hole transportation properties than electron transportation properties.

The first layer 203 having the structure as mentioned above has high hole injection properties. In the first layer 203, the aggregation of oxide semiconductor or a metal oxide is suppressed by a substance having high hole transportation properties contained in the layer. That is, crystallization of the first layer 203 is suppressed. In addition, the first layer 203 may be formed by, for example, at least two layers respectively containing semiconductor and a compound having high transportation properties with different mixture ratio from each other instead of being formed by one layer.

Further, the first layer 203 may further includes a compound having a high steric hindrance (that is, the compound having spatiality contrary to a plane structure) in addition to a compound selected from oxide semiconductor and a metal oxide, and a steric hindrance, 5,6,11,12-tetraphenyltetracene (abbreviated rubrene) is preferably used. Besides hexaphenylbenzene, diphenylanthracene, t-butylperylene, 9,10-di(phenyl)antracene, coumarin 545T, and the like can be used. In addition, dendrimer or the like can be used. Thus, crystallization of a molybdenum oxide can be further suppressed by mixing a substance with a structure having a high steric hindrance, that is, having spatiality contrary to a plane structure, into the first layer 203.

The second layer 204 is a layer formed by a substance having high hole transportation properties, for example, an aromatic amine compound (that is, the one having a bond of a benzene ring-nitrogen) such as α-NPD, TPD, TDATA, MTDATA, and the like. The foregoing substances are mainly the substances having hole mobility of $10^{-6}$ cm$^2$/Vs or more. Another substance can be used as long as it has higher hole transportation properties than electron transportation properties. In addition, the second layer 204 may be formed by stacking at least two layers containing the foregoing substances instead of being formed by one layer.

The third layer 205 is a layer containing a substance having high light-emitting properties. For example, a substance having high light-emitting properties such as N,N'-dimethylquinacridone (abbreviated DMQd), 2H-chromene-2-on (abbreviated coumarin), and a substance having high carrier transportation properties and a good film formation property, that is, a substance that is hard to be crystallized, such as tris(8-quinolinolato) aluminum (abbreviated Alq$_3$) or 9,10-di(2-naphthyl) anthracene (abbreviated DNA) can be used by freely combining with each other. Alq$_3$ and DNA have high light-emitting properties, consequently, the third layer 205 may be solely formed by Alq$_3$ or DNA.

The fourth layer 206 is a layer formed by a metal complex or the like having a quinoline skeleton or a benzoquinoline skeleton, for example, a substance having high electron transportation properties such as tris(8-quinolinolato)aluminum (abbreviated Alq$_3$), tris(5-methyl-8-quinolinolato)aluminum (abbreviated Almq$_3$), bis(10-hydroxybenz)[h]-quinolinato) beryllium (abbreviated BeBq$_2$), and bis(2-methyl-8-quinolinolato)-4-phenylphenolato-aluminum (abbreviated BAlq). Further, a metal complex having a oxadiazole ligand or a thiazole ligand such as bis[2-(2-hydroxyphenyl)-benzooxazolate]zinc (abbreviated Zn(BOX)$_2$), and bis[2-(2-hydroxyphenyl)-benzothiazolate]zinc (abbreviated Zn(BTZ)$_2$). Besides the metal complexes, 2-(4-biphenyl)-5-(4-tert-butylphenyl)-1,3,4-oxadiazole (abbreviated PBD), and 1,3-bis[5-(p-tert-butylphenyl)-1,3,4-oxadiazole-2-yl]benzene (abbreviated OXD-7), 3-(4-tert-butylphenyl)-4-phenyl-5-(4-biphenylyl)-1,2,4-triazole (abbreviated TAZ), and 3-(4-tert-butylphenyl)-4-(4-ethylphenyl)-5-(4-biphenylyl)-1,2,4-triazole (abbreviated p-EtTAZ), bathophenanthroline (abbreviated BPhen), bathocuproin (abbreviated BCP), and the like can be used. The foregoing substances are the substances having hole mobility of $10^{-6}$ cm$^2$/Vs or more. Another substance can be used as long as it has higher hole transportation properties than election transportation properties. In addition, the fourth layer 206 may be formed by at least two layers containing the foregoing substances instead of being formed by one layer.

As a material for the second electrode 207, metals having a small work function (at most 3.8 eV), alloys, electric conductive compounds, or a mixture of the above are preferably used. As a specific example of cathode materials, metals belonging to a 1 or 2 group of the periodic table of the elements, that is, alkali metals such as lithium (Li) or cesium (Cs); alkali earth metals such as magnesium (Mg), calcium (Ca), strontium (Sr); and alloys including the above elements (Mg:Ag, Al:Li) can be used. In case that a layer promoting electron injection is stacked between the second electrode 207 and a light-emitting layer, various conductive materials such as Al, Ar, ITO containing silicon, and the like can be used regardless of their work function can be used for the second electrode 207.

As the layer promoting electron injection, a compound of an alkali metal or an alkali earth metal such as lithium fluoride (LiF), cesium fluoride (CsF), calcium fluoride (CaF$_2$), and the like. Besides, a layer formed by a substance having electron transportation properties containing an alkali metal or an alkali earth metal, for example, Alq$_3$ containing magnesium (Mg), or the like can be used.

The first layer 203, the second layer 204, the third layer 205, and the fourth layer 206 may be formed by the method other than vapor deposition. For example, ink jetting, spin coating, and the like can be used. Each electrode or each layer may be formed by different film formation methods, respectively.

Within a light-emitting element according to the invention having the foregoing structure, a current is flowed due to electric potential differences generated between the first electrode 201 and the second electrode 207, and holes and electrons are recombined with each other within the third layer 205, which, is a layer containing high light-emitting properties, then, light is generated. Therefore, a light-emitting region is formed in the third layer 205. However, the entire third layer 205 is not required to be served as a light emission region. For example, the light-emitting region may be formed either the side of the second layer 204 or the fourth layer 206 within the third layer 205.

Light is emitted to the outside passing through either the first electrode 202 or the second electrode 207, or both of them. Therefore, either the first electrode 202 or the second electrode 207, or both of them are formed by a substance having light-transmitting properties. In the case that only the first electrode 202 is formed by a substance having light-transmitting properties, light is emitted from the substrate passing through the first electrode 202 as shown in FIG. 2A. In the case that only the second electrode 207 is formed by a substance having light-transmitting properties, light is emitted from the opposite side of the substrate passing through the second electrode 207. In the case that the first electrode 202 and the second electrode 207 are formed by substances having light-transmitting properties, light is emitted from both of the substrate and the opposite side of the substrate passing through the first electrode 202 and the second electrode 207.

The structure of a layer formed between the first electrode 202 and the second electrode 207 is not limited to the above described structure. The layer structure may have the other structure than the foregoing one as long as the structure is formed to have an area for the recombination of holes and electrons is located away from the first electrode 202 and the second electrode 207 to prevent quenching due to that a light-emitting region and a metal are close to one another; and a layer containing a compound selected from the group consisting of oxide semiconductor and a metal oxide, and a compound having high hole transportation properties (moreover, a compound having a high steric hindrance may be contained). The lamination structure of the layer is not restricted especially. A layer formed by a substance having high electron transportation properties or hole transportation properties, a substance having electron injection properties, a substance having hole injection properties, a substance having bipolar properties (high electron or hole transportation properties), or the like; and a layer formed by a compound selected from the group consisting of oxide semiconductor and a metal oxide, and a compound having high hole transportation properties may be freely combined with each other. Further, an area for recombination of carriers may be controlled by providing an ultra thin layer such as a silicon oxide layer. For example, the structure shown in FIG. 3 may be formed. However, a layer structure is not limited thereto.

Figure 3:
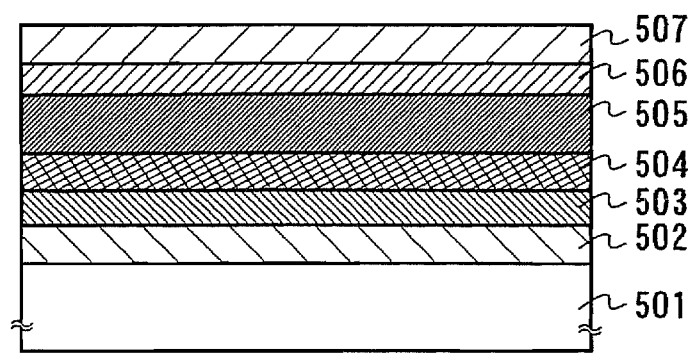
FIG. 3 is an explanatory cross-sectional view of a light-emitting element according to certain aspects of the present invention.

The light-emitting element shown in FIG. 3 is formed by stacking a first electrode 502 serving as a cathode; a first layer 503 formed by a substance having high electron transportation properties; a second layer 504 formed by a substance having high light-emitting properties; a third layer 505 formed by a substance having high hole transportation properties; a fourth layer 506 containing a compound selected from the group consisting of oxide semiconductor and a metal oxide, and a compound having high hole transportation properties; and a second electrode 507 serving as an anode. In addition, reference numeral 501 shown in FIG. 3 denotes a substrate.

According to this embodiment, a light-emitting element is manufactured over a glass or plastic substrate. A passive type light-emitting device can be manufactured by manufacturing a plurality of such light-emitting elements over one substrate. Instead of the glass or plastic substrate, a light-emitting element can be manufactured over a thin film transistor (TFT) array. Thus, an active matrix type light-emitting device that controls the drive of a light-emitting element by a TFT can be manufactured. The structure of the TFT is not especially restricted. The TFT may be either a staggered TFT or an inversely staggered TFT. A drive circuit formed over the TFT array substrate may be formed by both an N-type TFT and a P-type TFT. Alternatively, the drive circuit may be formed by either an N-type TFT or a P-type TFT.

Accordingly, the crystallization of the layer can be suppressed in the light-emitting element including a layer containing a compound selected from the group consisting of oxide semiconductor and a metal oxide, and a substance having high hole transportation properties. Therefore, the generation of a leak current due to the crystallization of the layer can be suppressed, and a long-lived light-emitting element can be obtained. The crystallization of the layer can be further suppressed, and a further long-lived light-emitting element can be obtained in the light-emitting element including a layer containing a compound selected from the group consisting of oxide semiconductor and a metal oxide, a substance having high hole transportation properties, and a substance having a high steric hindrance.

EXAMPLE 1

Hereinafter, a method for manufacturing a light-emitting element according to the present invention and properties of the light-emitting element is explained.

A first electrode is formed by depositing an indium tin oxide (ITO) over a glass substrate. Then, the glass substrate deposited with the ITO is processed in vacuum at 150° C. for 30 minutes.

A first layer is formed by co-evaporation of a molybdenum oxide and α-NPD having high hole transporting properties over the first electrode. The weight ratio of the molybdenum oxide and the α-NPD is 0.245:1. The first layer is formed to have a thickness of 130 nm. As used herein, the term "co-evaporation" refers to a method for evaporating each of materials from a plurality of evaporation sources provided in one processing chamber, and mixing the evaporated materials in the gas phase to deposit the mixed materials onto a subject.

A second layer is formed by vapor deposition of α-NPD over the first layer to have a thickness of 10 nm.

A third layer is formed by co-evaporation of $Alq_3$ and coumarin-6 over the second layer. The weight ratio of the $Alq_3$ and the coumarin-6 is 1:0.002. The third layer is formed to have a thickness of 37.5 nm.

A fourth layer is formed by vapor deposition of $Alq_3$ over the third layer to have a thickness of 37.5 mm.

A fifth layer is formed by vapor deposition of calcium fluoride ($CaF_2$) over the fourth layer to have a thickness of 1 nm.

A second electrode is formed by vapor deposition of aluminum over the fifth layer to have a thickness of 200 nm.

Figure 1:
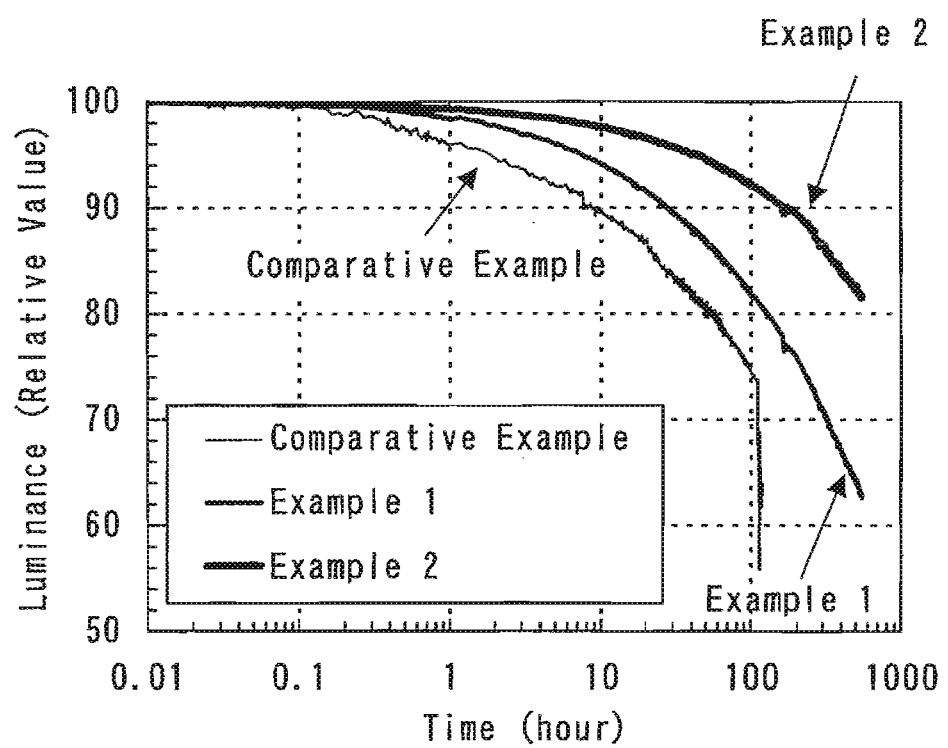
FIG. 1 is a graph for showing luminance variations with time of light-emitting elements according to certain aspects of the present invention and Comparative Example.
Figure 4:
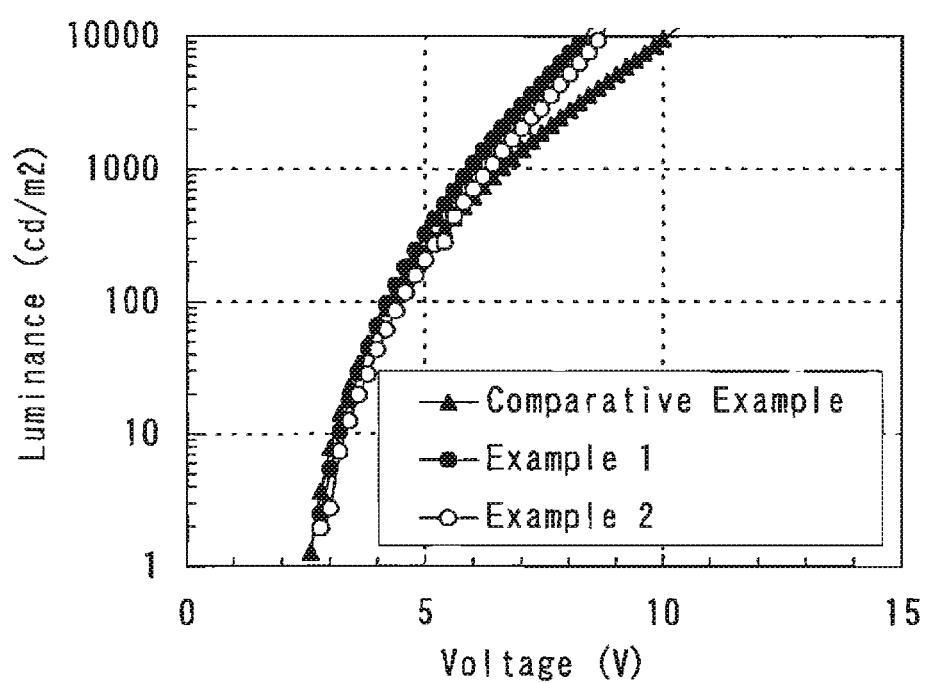
FIG. 4 shows luminance-voltage characteristics of light-emitting elements according to certain aspects of the present invention and Comparative Example 1.

FIGS. 1 and 4 show device characteristics of thus manufactured light-emitting element.

FIG. 4 shows luminance-voltage characteristics of a light-emitting element manufactured according to Example 1. In FIG. 4, a horizontal axis shows an applied voltage (V), and a vertical axis shows luminance ($cd/m^2$). FIG. 4 shows that an onset voltage, which is a voltage for electroluminescence of 1 $cd/m^2$ or more, is approximately 2.5 V.

FIG. 1 shows a measurement result of the variation of luminance per hour of a light-emitting element manufactured according to Example 1. In FIG. 1, a horizontal axis shows hour, and a vertical axis shows luminance. The luminance is represented its relative value to initial luminance based on the initial value of 100. The variation of luminance is measured by applying continuously a constant amount of current to a light-emitting element, that is, applying a stress to a light-emitting element; and the luminance of the light-emitting element is measured at given time intervals. A current that has a current density required to obtain electroluminescence with a luminance of 1000 $cd/m^2$ at initial state is applied, and the luminance obtained at the applied current is measured. FIG. 1 shows that after 100 hours luminance becomes the value of 82, that is, the luminance is decreased by 18% compared to the initial luminance.

EXAMPLE 2

A method for manufacturing a light-emitting element according to the present invention and characteristics of the light-emitting element is explained.

A first electrode is formed by depositing an indium tin oxide (ITO) over a glass substrate. The glass substrate deposited with the ITO is processed in vacuum at 150° C. for 30 minutes.

A first layer is formed over the first electrode by co-evaporation of a molybdenum oxide, α-NPD having high hole transportation properties, and rubrene having a high steric hindrance. The weight ratio of the molybdenum oxide and the rubrene is 0.245:0.018. The first layer is formed to have a thickness of 130 nm.

A second layer is formed by vapor deposition α-NPD over the first layer to have a thickness of 10 nm.

A third layer is formed over the second layer by co-evaporation of $Alq_3$ and coumarin-6 to have a thickness of 37.5 nm. The weight ratio of the $Alq_3$ and the coumarin-6 is 1:0.002.

A fourth layer is formed by vapor deposition of $Alq_3$ over the third layer to have a thickness of 37.5 nm.

A fifth layer is formed by vapor deposition of calcium fluoride ($CaF_2$) over the fourth layer to have a thickness of 1 nm.

A second electrode is formed by vapor deposition of aluminum over the fifth layer to have a thickness of 200 nm.

FIGS. 1 and 4 show device characteristics of thus manufactured light-emitting element. The measurement method or the like is the same as that described in Example 1.

FIG. 4 shows that an onset voltage, which is a voltage for electroluminescence of 1 $cd/m^2$ or more, is approximately 2.5 V.

FIG. 1 shows that after 100 hours luminance becomes the value of 92, that is, the luminance is decreased by 8% compared to the initial luminance.

EXAMPLE 3

A method for manufacturing a light-emitting element according to the present invention and properties of the light-emitting element is explained.

A first electrode is formed by depositing an indium tin oxide (ITO) over a glass substrate. The glass substrate deposited with the TTO is processed in vacuum at 150° C. for 30 minutes.

A first layer is formed over the first electrode by co-evaporation of a molybdenum oxide, 4,4-bis(N-(4-(N,N-di-m-tolylamino) phenyl)-N-phenylamino)biphenyl (abbreviated DNTPD) having high hole transportation properties, and rubrene having a high steric hindrance. The weight ratio of the molybdenum oxide, the DNTPD, and the rubrene is 0.5: 1: 0.05. The first layer is formed to have a thickness of 120 nm.

A second layer is formed by vapor deposition of α-NPD over the first layer to have a thickness of 10 nm.

A third layer is formed over the second layer by co-evaporation of $Alq_3$ and coumarin-6 to have a thickness of 37.5 nm. The weight ratio of the $Alq_3$ and the coumarin-6 is 1:0.003.

A fourth layer is formed by vapor deposition of $Alq_3$ over the third layer to have a thickness of 37.5 nm.

A fifth layer is formed by vapor deposition of calcium fluoride ($CaF_2$) over the fourth layer to have a thickness of 1 nm.

A second electrode is formed by vapor deposition of aluminum over the fifth layer to have a thickness of 200 nm.

Figure 8:
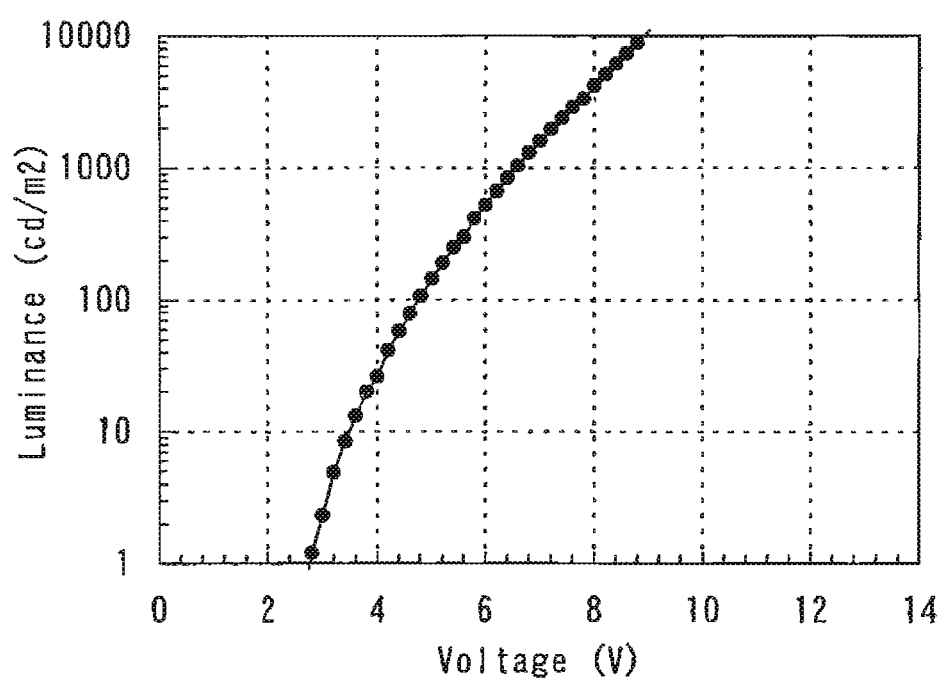
FIG. 8 shows luminance-voltage characteristics of light-emitting elements according to certain aspects of the present invention and Comparative Example 1.
Figure 9:
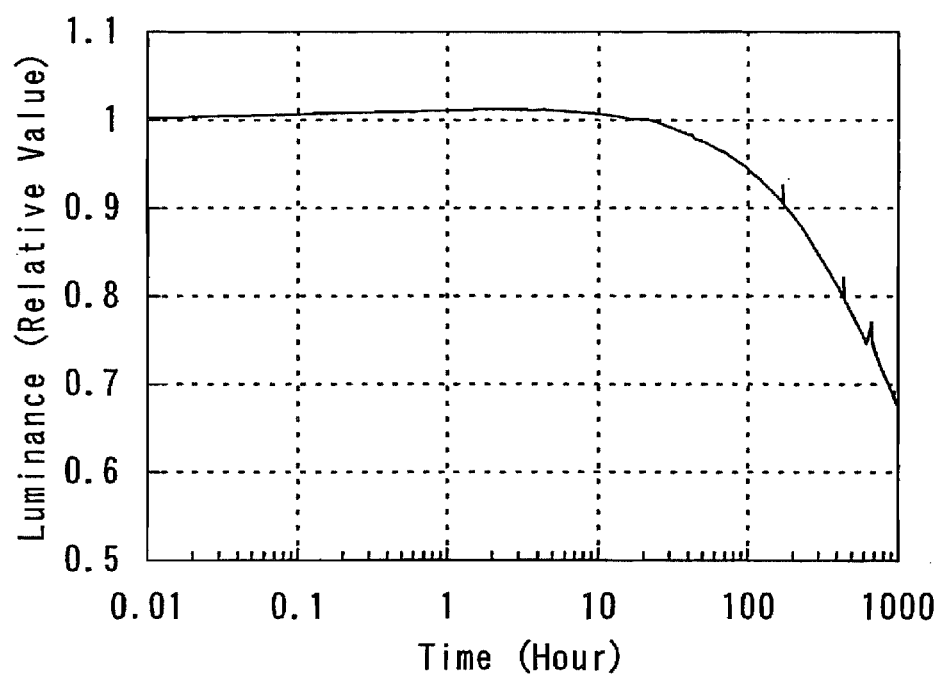
FIG. 9 is a graph for showing luminance variations with time of a light-emitting element according to certain aspects of the present invention.

FIGS. 8 and 9 shows device characteristics of thus manufactured light-emitting element. The measurement method or the like is the same as that described in Example 1. In FIG. 8, a horizontal axis shows an applied voltage (V), and a vertical axis shows luminance ($cd/m^2$). In FIG. 9, a horizontal axis shows hour, and a vertical axis shows luminance (relative value).

FIG. 8 shows that an onset voltage, which is a voltage for electroluminescence of 1 $cd/m^2$ or more, is approximately 2.4 V.

FIG. 9 shows that after 100 hours luminance becomes the value of 93, that is, the luminance is decreased by 7% compared to the initial luminance.

Comparative Example 1

As a comparative example, a method for manufacturing a light-emitting element in which a second layer is formed by only a molybdenum oxide, and device characteristics of the light-emitting element are explained.

An indium tin oxide (ITO) is deposited over a glass substrate to form a first electrode. The glass substrate deposited with the ITO is processed in vacuum at 150° C. for 30 minutes.

A first layer is formed by vapor deposition of a molybdenum oxide over the first electrode to have a thickness of 100 nm.

A second layer is formed by vapor deposition of α-NPD over the first layer to have a thickness of 60 nm.

A third layer is formed over the second layer by co-evaporation of $Alq_3$ and coumarin to have a thickness of 37.5 nm. The weight ratio of the $Alq_3$ and the coumarin is 1:0.002.

A fourth layer is formed by vapor deposition of $Alq_3$ over the third layer to have a thickness of 37.5 nm.

A fifth layer is formed by vapor deposition of calcium fluoride ($CaF_2$) over the fourth layer to have a thickness of 1 nm.

A second electrode is formed by vapor deposition of aluminum over the fifth layer to have a thickness of 200 nm.

FIGS. 1 and 4 shows device characteristics of thus manufactured light-emitting element. The measurement method or the like is the same as that described in Example 1.

FIG. 4 shows that an onset voltage, which is a voltage for electroluminescence of 1 $cd/m^2$ or more, is approximately 2.5 V.

FIG. 1 shows that the luminance of a light-emitting element according to the comparative example after 100 hours is drastically decreased, and light emission cannot be generated. This is caused by the fact that a leak current is generated due to the crystallization of the second layer.

Accordingly, the light-emitting element described in Example 1 or 2 emits light at the same driving voltage for the light-emitting element described in Comparative Example. As same as the light-emitting element having a layer formed by only a molybdenum oxide, a light-emitting element according to the invention is operated at a low voltage. The lifetime of the light-emitting element described in Example 1 or 2 can be extended. This arises from the fact that the crystallization of P-type compounds is suppressed by being mixed with a compound having high transportation properties such as α-NPD or a compound having a high steric hindrance such as rubrene.

EXAMPLE 4

An active matrix light-emitting device having a light-emitting element according to the present invention is explained in Example 4.

As shown in FIG. 5, a drive transistor 91 and a light-emitting element 92 according to the invention are provided over a substrate 90. The drive transistor 91 for driving a light-emitting element is electrically connected to the light-emitting element 92 according to the invention. As used herein, the term "light-emitting element" refers to a layer which includes a light-emitting layer between an electrode 93 and an electrode 94, and which includes partly a layer containing a molybdenum oxide, a substance with high transportation properties, a substance with a high steric hindrance. The light-emitting element 92 is divided by a bank layer 95.

A light-emitting element according to the invention may have the structure in which an electrode serving as an anode is located at a lower side (the term "lower" refers to the region where a drive transistor is provided in response to the light-emitting element) and an electrode serving as a cathode is located at an upper side (the term "upper" refers to the region where a drive transistor is not provided in response to the light-emitting element). Alternatively, the light-emitting element may have the structure in which the electrode serving as a cathode is located at the lower side, and the electrode serving as anode is located at the upper side.

In the case of the former, the drive transistor 91 is a p-channel type, and in the case of the latter, the drive transistor 91 is an n-channel type. The drive transistor 91 may be either a staggered type or an inversely staggered type. The semiconductor layer of the drive transistor 91 may be any one of a crystalline semiconductor layer, an amorphous semiconductor layer, or a semiamorphous semiconductor layer.

The semiamorphous semiconductor has an intermediate structure between an amorphous structure and a crystalline structure (including single crystals and poly crystals). The semiamorphous semiconductor has a stable third state with respect to free energy, and a crystalline region having a short-range order and lattice distortion. At least a part of the semiconductor, crystal grains with grain diameters of from 0.5 to 20 nm. A raman spectrum is shifted to a lower wave number than 520 $cm^{-1}$. By X-ray diffraction, diffraction peaks (111), (220) that may be derived from a Si crystalline lattice are observed. Hydrogen or halogen of 1 atomic % or more is contained the semiconductor as neutralizer for dangling bond. Such semiconductor is referred to as what is called micro crystal semiconductor. A silicide gas is formed by glow discharge decomposition (plasma CVD). As the silicide gas, $Si_2H_6$, $SiH_2Cl_2$, $SiHCl_3$, $SiCl_4$, $SiF_4$, or the like in addition to $SiH_4$ can be used. The silicide gas can be diluted by $H_2$, or the $H_2$ and one or a plurality of rare gas elements selected from the group consisting of He, Ar, Kr, and Ne. The dilution rate is in the range of from 2 to 1000 times. An applied voltage is in the range of from 0.1 to 133 Pa. A power source frequency is in the range of from 1 to 120 MHz, preferably, 13 to 60 MHz. A heat temperature for a substrate is at most 300° C., preferably, 100 to 250° C. As impurity elements in the semiconductor film, atmospheric constituents such as oxygen, nitrogen, carbon, and the like have preferably concentrations of at most $1\times10^{20}/cm^3$, especially, oxygen concentration is at most $5\times10^{19}/cm^3$, preferably, $1\times10^{19}/cm^3$. A TFT (thin film transistor) including semiamorphous semiconductor has mobility of approximately from 1 to 10 $m^2/Vsec$.

Either the electrode serving as an anode or the electrode serving as a cathode, or both of them are formed by a material having light-transmitting properties.

In case that an electrode serving as an anode is located at the lower side, and only the electrode serving as an anode is formed by a substance having light-transmitting properties; light is emitted through the side provided with a drive transistor as shown in FIG. 5A. Further, in case that an electrode serving as a cathode is located at the lower side, and only the electrode serving as a cathode is formed by a material having light-transmitting properties, light is emitted through the side provided with a drive transistor as shown in FIG. 5A. In case that an electrode serving as an anode is located at the lower side, and only the electrode serving as a cathode is formed by a material having light-transmitting properties, light is emitted through the opposite side provided with a chive transistor as shown in FIG. 5B. In case that an electrode serving as a cathode is located at the lower side, and only the electrode serving as an anode is formed by a material having light-transmitting properties, light is emitted through the opposite side provided with a drive transistor as shown in FIG. 5B. In case that both of an electrode serving as an anode and an electrode serving as a cathode are formed by materials having light-transmitting properties, light is emitted from both sides as shown in FIG. 5C irrespective of which electrode is provided to lower side or upper side.

The light-emitting element may emit either monochromatic light or light in full color such as red (R), green (G), blue (B), and the like. Each light-emitting element is preferably divided by a bank layer. The bank layer may be formed by a material that contains either an inorganic substance or an organic substance, or both of the inorganic substance and organic substance. For example, a silicon oxide film may be used. A material having a skeleton structure formed by the bond of acrylic, polyimide, and (a substance in which a skeleton is formed by the bond of silicon (Si) and oxygen (O); and at least hydrogen is included as a substituent, or at least one element selected from the group consisting of fluoride, alkyl group, and aromatic hydrocarbon is included as the substituent), or the like may also be used. Further, the bank layer is preferably formed to have a curved edge portion whose radius of curvature is continuously varied.

Since a light-emitting element according to the present invention has a long lifetime, a light-emitting device manufactured by practicing the present invention can display images and emit light in a long term.

EXAMPLE 5

A light-emitting device including a light-emitting element according to the present invention as shown in Example 4 is mounted on various electric appliances after attached with an external input terminal.

Such electric appliances manufactured by practicing the present invention can display high quality images in a long term. This arises from the fact that a light-emitting element according to the invention has long lifetime.

In Example 5, a light-emitting device including a light-emitting element and electric appliances mounted with the light-emitting element are explained with reference to FIGS. 6 and 7.

Figure 6:
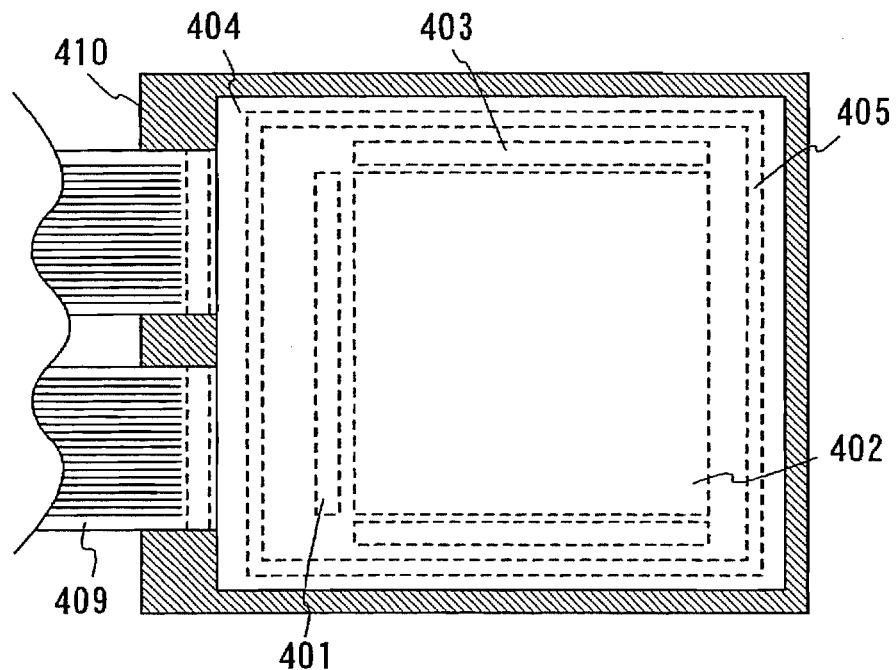
FIG. 6 is a top view of a light-emitting device including a light-emitting element according to certain aspects of the present invention.

FIG. 6 is a top view of a light-emitting device including a light-emitting element according to the present invention. FIG. 7 is one embodiment of an electric appliance only, and the structure of a light-emitting device is not limited thereto.

In FIG. 6, reference numeral 401 indicated by dotted line denotes a drive circuit portion (a source side drive circuit); 402, a pixel portion; and 403, a drive circuit portion (a gate side drive circuit). Reference numeral 404 denotes a sealing substrate, and 405 denotes a portion applied with sealing agent.

Signals are inputted to the source side drive circuit 401 and the gate side drive circuit 403 when these circuits receive video signals, clock signals, start signals, reset signals, and the like via wirings provided to a device substrate 410 from an FPC (flexible print circuit) 409 serving as an external input terminal. Despite illustrated only the FPC in FIG. 6, the FPC may be provided with a printed wiring board (PWB). A light-emitting device according to Example 5 refers to not only a main body of a light-emitting device, but also a main body provided with an FPC or a PWB.

Figure 7:
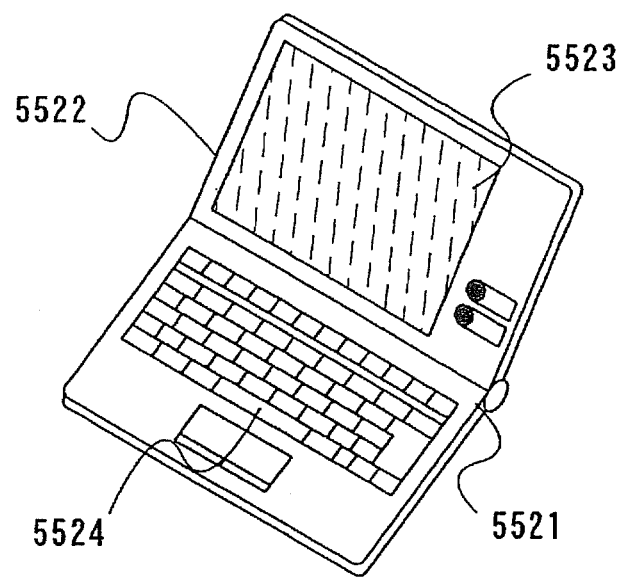
FIG. 7 is a view for showing an electric appliance mounted with a light-emitting device including a light-emitting element according to certain aspects of the present invention.

FIG. 7 is one embodiment of an electric appliance installed with a light-emitting device as shown in FIG. 6.

FIG. 7 shows a laptop computer manufactured by practicing the present invention composed of a main body 5501, a housing 5502, a display portion 5503, a keyboard 5504, and the like. A display device can be completed by incorporating a light-emitting device including a light-emitting element according to the invention into the laptop computer.

Despite explained a laptop computer in Example 5, a cellular phone, a TV reception set, a car navigation, a lighting system, and the like may be installed with a light-emitting device including a light-emitting element according to the invention.

EXAMPLE 6

A method for manufacturing a light-emitting element according to the present invention, and device characteristics of the light-emitting element are explained in Example 6. In Example 6, four light-emitting elements, that is, a light-emitting element (1), a light-emitting element (2), a light-emitting element (3), and a light-emitting element (4), all of which have first layers with different thicknesses, are manufactured.

A first electrode is formed by an indium tin oxide (ITO) containing a silicon oxide over a glass substrate. Then, the glass substrate provided with the first electrode is treated in vacuum at 150° C. for 30 minutes.

A first layer is formed by co-evaporation of a molybdenum oxide, rubrene, and DNTPD over the first electrode to have a weight ratio of 0.67:1:0.02, respectively. The first layer of a light-emitting element (1) is formed to have a thickness of 40 nm. The first layer of a light-emitting element (2) is formed to have a thickness of 80 nm. The first layer of a light-emitting element (3) is formed to have a thickness of 120 nm. The first layer of a light-emitting element (4) is formed to have a thickness of 160 nm.

A second layer is formed by vapor deposition of α-NPD over the first layer to have a thickness of 10 nm.

A third layer is formed by co-evaporation of $Alq_3$ and coumarin 6 over the second layer to have a weight ratio of 1:0.005. The third layer is formed to have a thickness of 375 nm.

A fourth layer is formed by vapor deposition of $Alq_3$ over the third layer to have a thickness of 37.5 nm.

A fifth layer is formed by vapor deposition of lithium fluoride (LiF) over the fourth layer to have a thickness of 1 nm.

A second electrode is formed by vapor deposition of aluminum over the fifth layer to have a thickness of 200 nm.

Figure 10:
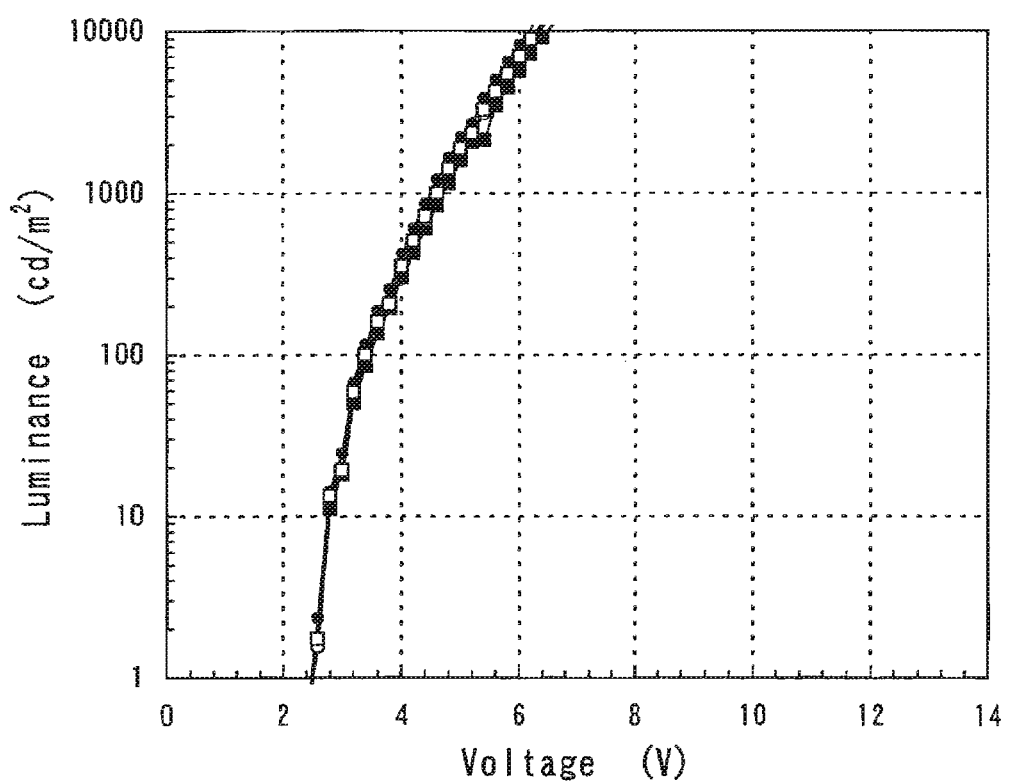
FIG. 10 shows luminance-voltage characteristics of light-emitting elements according to certain aspects of the present invention.
Figure 11:
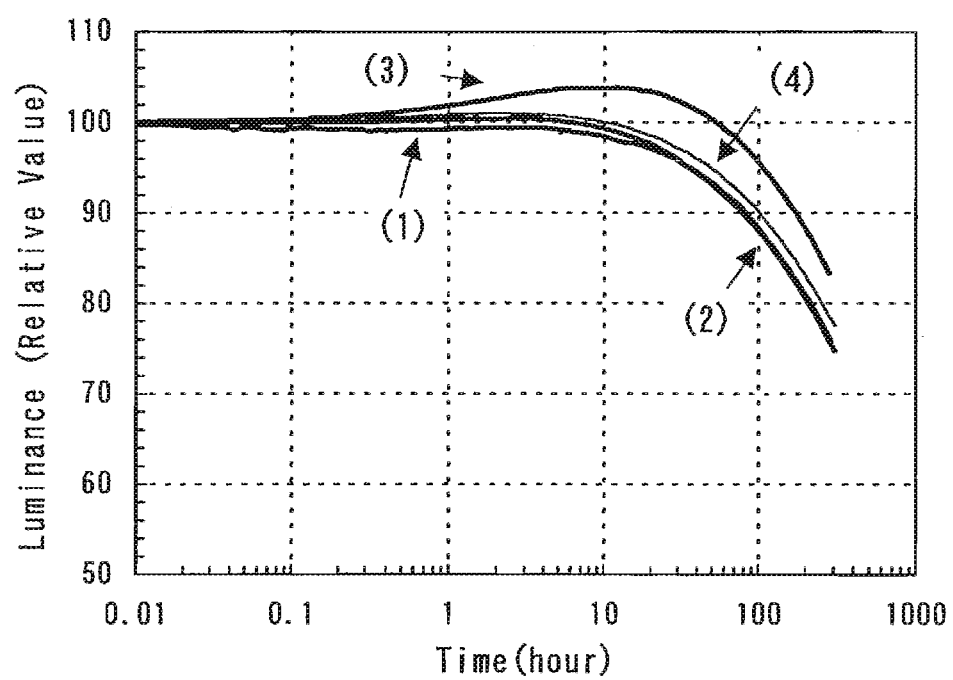
FIG. 11 is a graph for showing luminance variations with time of a light-emitting element according to certain aspects of the present invention.

FIGS. 10 and 11 show the device characteristics of thus manufactured light-emitting elements.

FIG. 10 shows luminance-voltage characteristics of light-emitting elements manufactured according to Example 6. In FIG. 10, a horizontal axis shows voltage (V), and a vertical axis shows luminance ($cd/m^2$). In addition, closed circles indicate characteristics of the light-emitting element (1); open circles indicate characteristics of the light-emitting element (2); closed squares indicate characteristics of the light-emitting element (3); and open squares indicate characteristics of the light-emitting element (4). FIG. 10 shows that an onset voltage, which is a voltage for electroluminescence of 1 $cd/m^2$ or more, is approximately 2.5 V in each light-emitting element. The onset voltages are approximately the same with each other despite the thickness of the first layer of each the light-emitting element. That is, the onset voltage for a light-emitting element practiced by the present invention is insensitive to the thickness of the first layer. Therefore, external coupling efficiency of light emission from a light-emitting element in which an electrode is used to reflect light emission becomes easily improved by controlling an optical path length by variations of the thickness of a first layer according to the present invention.

FIG. 11 shows a measurement result of the variation of luminance per hour of a light-emitting element manufactured according to Example 6. In FIG. 11, a horizontal axis shows hour, and a vertical axis shows luminance. The luminance is represented its relative value to initial luminance based on the initial value of 100. The variation of luminance is measured by applying continuously a constant amount of current to a light-emitting element, that is, applying a stress to a light-emitting element; and the luminance of the light-emitting element is measured at given time intervals. A current that has a current density required to obtain electroluminescence with a luminance of 3000 $cd/m^2$ at an initial state is applied, and the luminance obtained at the applied current is measured. FIG. 11 shows that after 100 hours the luminance is decreased by 14% or less to the initial luminance in each the light-emitting element (1), (2), (3), and (4). Hence, the luminance of a light-emitting element practiced by present invention is hardly deteriorated.

EXAMPLE 7

A method for manufacturing a light-emitting element according to the present invention and device characteristics of the light-emitting element are explained in Example 7. In Example 7, nine light-emitting elements, that is, a light-emitting element (11), a light-emitting element (12), a light-emitting element (13), a light-emitting element (14), a light-emitting element (15), a light-emitting element (16), a light-emitting element (17), a light-emitting element (18), and a light-emitting element (19), all of which have first, electrodes formed by different materials, are manufactured.

A first electrode for the light-emitting element (11) is formed by aluminum containing several % silicon over a glass substrate. A first electrode for the light-emitting element (12) is formed by aluminum containing several % titanium over a glass substrate. A first electrode of the light-emitting element (13) is formed by titanium over a glass substrate. A first electrode of the light-emitting element (14) is formed by titanium nitride over a glass substrate. A first electrode of the light-emitting element (15) is formed by tantalum over a glass substrate. A first electrode of the light-emitting element (16) is formed by tantalum nitride over a glass substrate. A first electrode of the light-emitting element (17) is formed by tungsten over a glass substrate. A first electrode of the light-emitting element (18) is formed by chromium over a glass substrate. A first electrode of the light-emitting element (19) is formed by molybdenum over a glass substrate.

Then, the glass substrate provided with the first electrode is treated in vacuum at 150° C. for 30 minutes.

A first layer is formed by co-evaporation of a molybdenum oxide, rubrene, and a-NPD over the first electrode to have a weight ratio of 0.1:1:0.02, respectively. The first layer is formed to have thickness of 60 nm.

A second layer is formed by vapor deposition of α-NPD over the first layer to have a thickness of 10 nm.

A third layer is formed by co-evaporation of $Alq_3$ and coumarin 6 over the second layer to have a weight ratio of 1:0.005. The third layer is formed to have a thickness of 40 nm.

A fourth layer is formed by vapor deposition of $Alq_3$ over third layer to have a thickness of 20 nm.

A fifth layer is formed by co-evaporation of lithium (Li) and 4,4'-bis(5-methylbenzoxazole-2-yl)stilbene (abbreviated BzOs) over the fourth layer to have a weight ratio of 0.02:1, respectively. The fifth layer is formed to have a thickness of 20 nm.

A second electrode is formed by an indium tin oxide (ITO) over the fifth layer to have a thickness of 110 nm.

Figure 12:
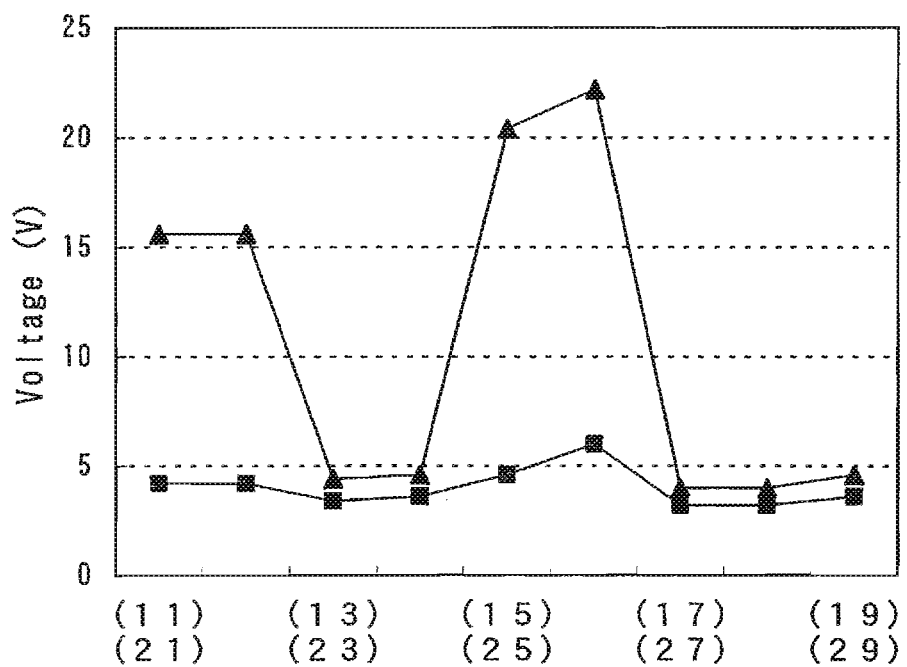
FIG. 12 is a graph for showing voltages for electroluminescence of 1 cd/m² or more according to certain aspects of the present invention and Comparative Example 2.

To measure an onset voltage for electroluminescence of 1 $cd/m^2$ or more, voltage is applied to each of thus manufactured light-emitting element so that an electric potential of the first electrode is higher than that of the second electrode. FIG. 12 shows the measurement results indicated by closed squares. In FIG. 12, a horizontal axis shows the manufactured light-emitting elements, and a vertical axis shows voltage (V).

COMPARATIVE EXAMPLE 2

As a comparative example for the light-emitting elements described in Example 7, a light-emitting element (21), a light-emitting element (22), a light-emitting element (23), a light-emitting element (24), a light-emitting element (25), a light-emitting element (26), a light-emitting element (27), a light-emitting element (28), and a light-emitting element (29) are explained hereinafter.

Each layer composing the light-emitting elements (21) to (29) is manufactured by the same material to have the same thickness as those of the light-emitting elements (11) to (19) except that the first layer of each the light-emitting elements (21) to (29) is formed by copper phthalocyanine A first electrode of the light-emitting element (21) is formed by aluminum containing several % silicon. A first electrode of the light-emitting element (22) is formed by aluminum containing several % titanium. A first electrode of the light-emitting element (23) is formed by titanium. A first electrode of the light-emitting element (24) is formed by titanium nitride. A first electrode of the light-emitting element (25) is formed by tantalum. A first electrode of the light-emitting element (26) is formed by tantalum nitride. A first electrode of the light-emitting element (27) is formed by tungsten. A first electrode of the light-emitting element (28) is formed by chromium. A first electrode of the light-emitting element (29) is formed by molybdenum.

To measure an onset voltage for electroluminescence of 1 $cd/m^2$ or more, voltage is applied to each of thus manufactured light-emitting element so that an electric potential of the first electrode is higher than that of the second electrode. FIG. 12 shows the measurement results indicated by closed triangles.

FIG. 12 shows that the onset voltages of the light-emitting elements (21) to (29) having first layers formed by copper phthalocyanine are different from each other, that is, the onset voltages depend on the material for forming the first electrode. On the other hand, the onset voltages of the light-emitting elements (11) to (21) practiced by the present invention are almost the same with each other despite a material for forming the first electrode. The light-emitting element according to the present invention is less subject to kinds of materials for forming an electrode or the like. Therefore, it becomes easy to select an electrode formed by a material having better reflectivity in the case that a light-emitting element in which an electrode is used to reflect light emission is manufactured according to the present invention.

EXAMPLE 8

A method for manufacturing a light-emitting element according to the present invention and characteristics of the light-emitting element are explained hereinafter. In Example 8, light-emitting elements, all of which have first layers with different thicknesses, are manufactured. The film thickness dependence of a driving voltage of the light-emitting elements will be revealed.

The light-emitting elements (1) to (4) manufactured in Example 6 are used as samples. The first layer in the light-emitting element (1) is formed to have a thickness of 40 nm. The first layer in the light-emitting element (2) is formed to have a thickness of 80 nm. The first layer in the light-emitting element (3) is formed to have a thickness of 120 nm. The first layer in the light-emitting element (4) is formed to have a thickness of 160 nm.

Figure 13:
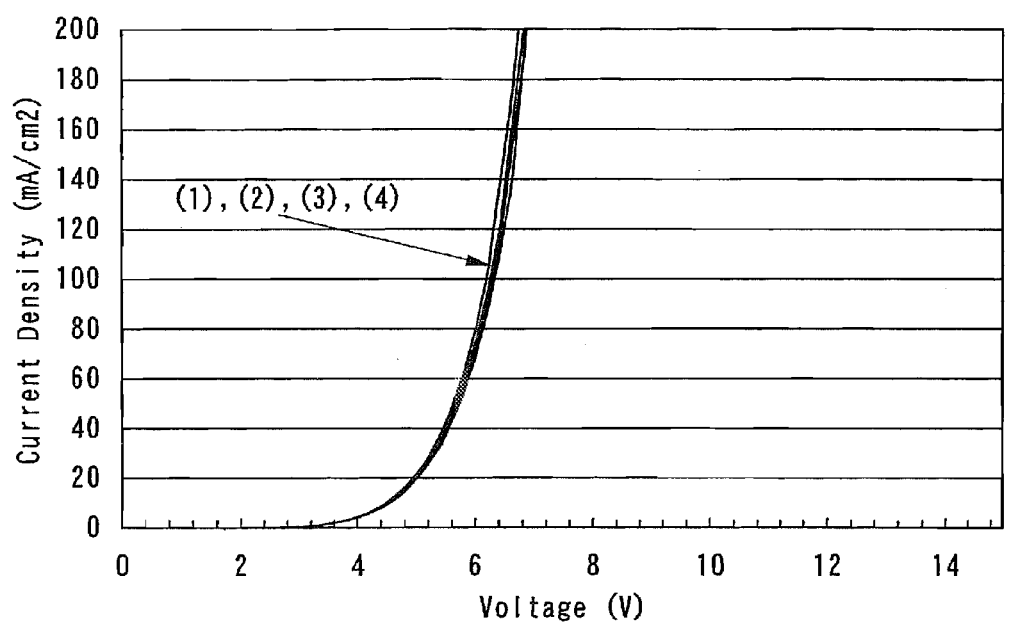
FIG. 13 is a graph for showing current density-voltage characteristics of light-emitting elements according to certain aspects of the present invention.

Voltage is applied to each of the light-emitting elements so that an electric potential of a first electrode is higher than that of a second electrode. FIG. 13 shows current density-voltage characteristics of the light-emitting elements (1) to (4). The current density-voltage characteristics of the light-emitting elements (1) to (4) are hardly different from each other despite the difference in the thicknesses of the first layers. Therefore, the increase of a thickness of the first layer that is formed by a molybdenum oxide, rubrene, and DNTPD does not result in the increase of a driving voltage.

COMPARATIVE EXAMPLE 3

As a comparative example for the light-emitting elements described in Example 8, a light-emitting element (30), a light-emitting element (31), a light-emitting element (32), a light-emitting element (33), a light-emitting element (34), and a light-emitting element (35) are explained hereinafter.

The light-emitting elements (30) to (35), all of which have second layers with different thicknesses, are manufactured. A first layer is formed by copper phthalocyanine to have a thickness of 20 nm. The second layer is formed by α-NPD by vapor deposition. The second layer of the light-emitting element (30) is formed to have a thickness of 60 nm. The second layer of the light-emitting element (31) is formed to have a thickness of 80 nm. The second layer of the light-emitting element (32) is formed to have a thickness of 100 nm. The second layer of the light-emitting element (33) is formed to have a thickness of 120 nm. The second layer of the light-emitting element (34) is formed to have a thickness of 140 nm. The second layer of the light-emitting element (35) is formed to have a thickness of 160 nm.

Then, a third layer is formed by co-evaporation of $Alq_3$ and coumarin-6 over a second layer to have a weight ratio of 1:0.005. The third layer is formed to have a thickness of 37.5 nm. A fourth layer is formed by vapor deposition of $Alq_3$ to have a thickness of 37.5 nm over the third layer. A fifth layer is formed by vapor deposition of calcium fluoride ($CaF_2$) to have a thickness of 1 nm over the fourth layer. A second electrode is formed by vapor deposition of aluminum to have a thickness of 200 nm over the fifth layer.

Figure 14:
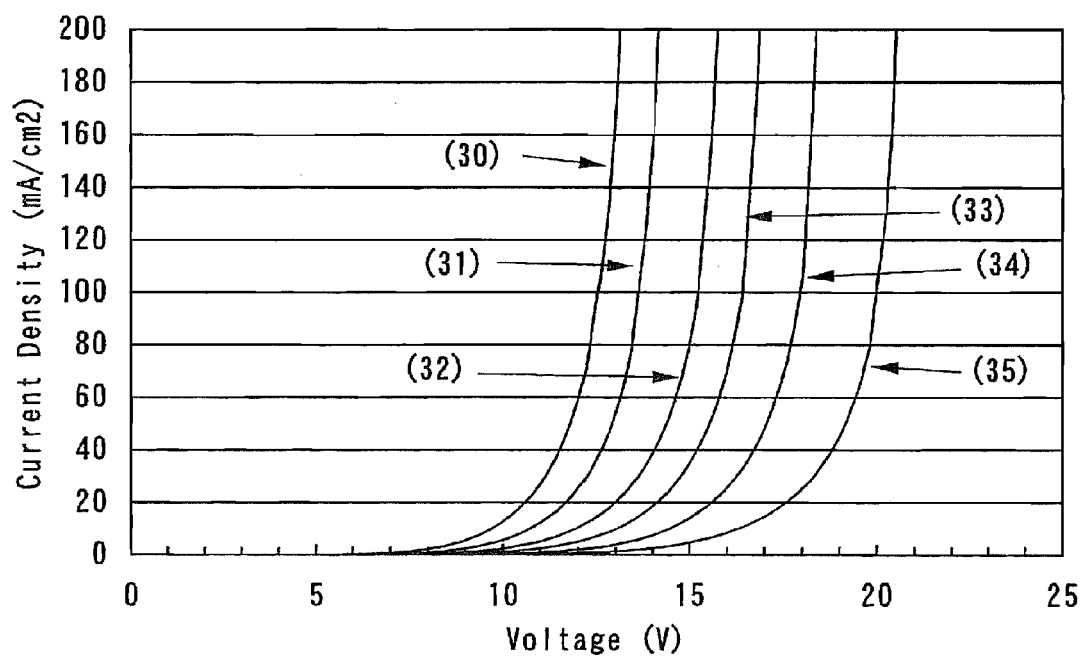
FIG. 14 is a graph for showing current density-voltage characteristics of light-emitting elements according to certain aspects of Comparative Example 3.

To operate each of the light-emitting elements, voltage is applied thereto so that an electric potential of the first electrode is higher than that of the second electrode. FIG. 14 shows current density-voltage characteristics of the light-emitting elements (30) to (35). The driving voltages of the light-emitting elements are increased with increasing the thicknesses of the second layers. Therefore, the increase of a thickness of the second layer formed by α-NPD results in the increase of the driving voltage.

COMPARATIVE EXAMPLE 4

As a comparative example for the light-emitting elements described in Example 8, a light-emitting element (36), a light-emitting element (37), and a light-emitting element (38) are explained hereinafter. Each of first layers is formed by a molybdenum oxide to have a different thickness form each other. A second layer is formed by copper phthalocyanine to have a thickness of 20 nm. A third layer is formed by vapor deposition of α-NPD to have a thickness of 40 nm.

Then, a fourth layer is formed by co-evaporation of $Alq_3$ and coumarin-6 to have a thickness of 37.5 nm over the third layer. A fifth layer is formed by vapor deposition of $Alq_3$ to have a thickness of 37.5 nm over the fourth layer. A sixth layer is formed by vapor deposition of $CaF_2$ to have a thickness of 1 nm over the fifth layer. A second electrode is formed by vapor deposition of aluminum to have a thickness of 200 nm over the sixth layer.

To operate each of the light-emitting elements, voltage is applied thereto so that an electric potential of the first electrode is higher than that of the second electrode.

Figure 15:
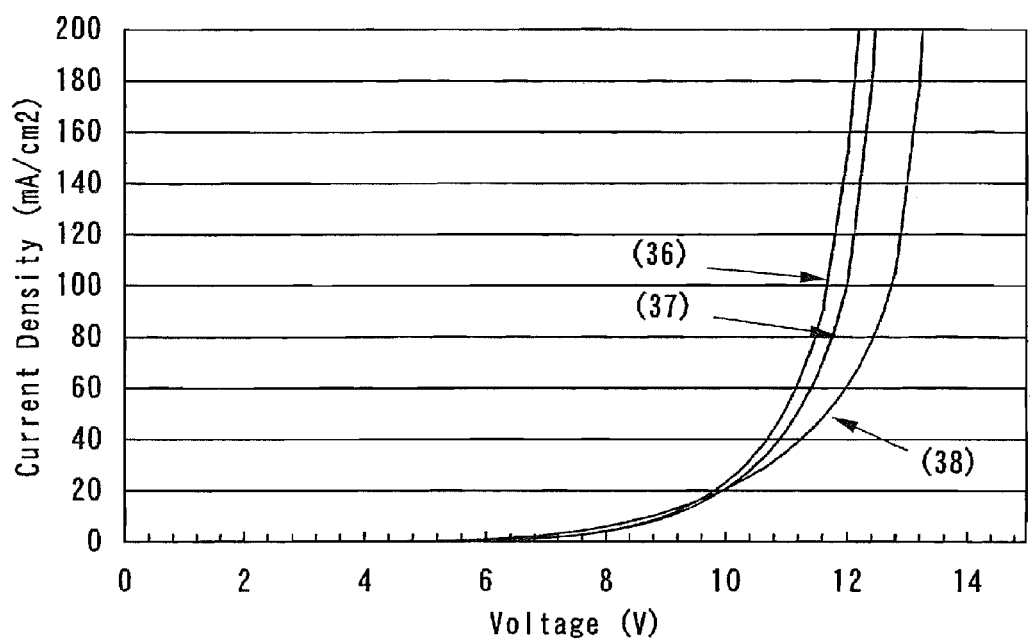
FIG. 15 is a graph for showing current density-voltage characteristics of light-emitting elements according to certain aspects of Comparative Example 4.

FIG. 15 shows current density-voltage characteristics of the light-emitting elements (36) to (38). The driving voltages of the light-emitting elements are increased with increasing the thicknesses of the first layers formed by molybdenum oxides.

Table 1 shows the results of film thickness dependence of driving voltage provided by Example 8, Comparative Example 3, and Comparative Example 4. Table 1 shows the data of a driving voltage required to apply a current of 100 $mA/cm^2$ to a light-emitting element.

TABLE 1

| Thickness [nm] | Required Driving Voltage [V] for Applying 100 mA/cm² to Sample | | |
|---|---|---|---|
| | Example 8 | Comparative Table 3 | Comparative Table 4 |
| 20 | — | — | 11.7 |
| 40 | 6.1 | — | — |
| 50 | — | — | 11.9 |
| 60 | — | 12.5 | — |
| 80 | 6.3 | 13.5 | — |
| 100 | — | 15.3 | 12.7 |
| 120 | 6.3 | 16.5 | — |
| 140 | — | 18.9 | — |
| 160 | 6.3 | 19.9 | — |

In Example 8, a driving voltage of 6.1 to 6.3 V is required to apply a current of 100 mA/cm² to the light-emitting elements (1) to (4). On the other hand, in Comparative Example 3, a driving voltage of 12.5 to 19.9 V is required to apply a current of 100 mA/cm² to the light-emitting elements (30) to (35). In Comparative Example 4, a driving voltage of 11.7 to 12.7 V is required to apply a current of 100 mA/cm² to the light-emitting elements (36) to (38).

The results illustrated in Table 1 shows that a driving voltage of a light-emitting element provided with a layer formed by a mixture of an organic compound and an inorganic can be lower than that of a light-emitting element provided with a layer formed by α-NPD or a molybdenum oxide that is an inorganic compound. Moreover, it also shows that the increase of the driving voltage can be prevented even if the thickness of the layer is increased.

Therefore, a driving voltage can be reduced by using the light-emitting element according to the present invention, accordingly, the power consumption of the light-emitting element can be reduced. Further, a thickness of a light-emitting element can be increased, and so it becomes possible to reduce short-circuit deterioration between a pair of electrodes.

EXAMPLE 9

Characteristics of a QVGA active matrix light-emitting device having a screen size of 2.4 inches are explained in Example 9. The active matrix light-emitting device drives a light-emitting element by a transistor as in the case with Example 4. The light-emitting device has the configuration explained in the following.

A first electrode is formed by an indium tin oxide containing a silicon oxide. A first layer is formed by co-evaporation of a molybdenum oxide and α-NPD having high hole transportation properties over the first electrode.

A light-emitting device in which the first layer is formed by a mixture of a molybdenum oxide and α-NPD to have a thickness of 120 nm is referred to as a light-emitting device 1. Similarly, a light-emitting device in which the first layer is formed to have a thickness of 240 nm is referred to as a light-emitting device 2.

A second layer is formed by vapor deposition of α-NPD to have a thickness of 10 nm over the first layer. A third layer is formed by co-evaporation of Alq₃ and coumarin-6 to have a thickness of 40 nm over the second layer.

A fourth layer is formed by vapor deposition of Alq₃ to have a thickness of 30 nm over the third layer. A fifth layer is formed by vapor deposition of calcium fluoride ($CaF_2$) to have a thickness of 1 nm over the fourth layer. A second electrode is formed by vapor deposition of aluminum to have a thickness of 200 nm over the fifth layer.

The number of dark spots (pixels that do not emit light) in the light-emitting devices 1 and 2 is checked at the beginning of electrical conduction and after a temperature cycle test (+85° C. (four hours) to −40° C. (four hours)) for 60 hours.

The light-emitting device 1 has the average of the number of dark spots of 0.7 at the beginning of electrical conduction, and 2.3 after the temperature cycle test. The light-emitting device 2 has the average of the number of dark spots of 0.5 at the beginning of electrical conduction, and 0.5 after the temperature cycle test. As used herein, the term "average of the number of dark spots" refers to an average value in examined closed triangle numbers of light-emitting device.

COMPARATIVE EXAMPLE 5

As a comparative example for Example 9, an active matrix light-emitting device 3 in which a light-emitting element has a different configuration is manufactured.

The light-emitting element is formed in the following manner. A first layer is formed by copper phthalocyanine to have a thickness of 20 nm. A second layer is formed by α-NPD to have a thickness of 40 nm. A third layer is formed by co-evaporation of Alq₃ and coumarin 6 to have a thickness of 40 nm over the second layer. A fourth layer is formed by vapor deposition of Alq₃ to have a thickness of 40 nm over the third layer. A fifth layer is formed by vapor deposition of calcium fluoride ($CaF_2$) to have a thickness of 1 nm over the fourth layer. A second electrode is formed by vapor deposition of aluminum to have a thickness of 200 nm over the fifth layer.

The number of dark spots in the light-emitting device 3 is checked at the beginning of electrical conduction and after a temperature cycle test (+85° C. (four hours) to −40° C. (four hours)) for 60 hours.

The light-emitting device 3 has the average of the number of dark spots of 18 at the beginning of electrical conduction, and 444 after the temperature cycle test. The average of the number of dark spots after the temperature cycle test is increased by 25 times as many as that at the beginning of electrical conduction.

Table 2 illustrates the results of the number of dark spots after the temperature cycle test (+85° C. (four hours) to −40° C. (four hours)) for 60 hours in Example 9 and Comparative Example 5.

TABLE 2

| | Number of Dark Spot Pixels | |
|---|---|---|
| | Beginning of Electrical Conduction | After Temperature Cycle Test |
| Light-emitting Device (1) | 0.7 | 23 |
| Light-emitting Device (2) | 0.5 | 0.5 |
| Light-emitting Device (3) | 18 | 444 |

Dark spots are hardly observed in the light-emitting devices 1 and 2 according to Example 9 at the beginning of electrical conduction, and are not increased after a temperature cycle test. On the other hand, a great number of dark spots are observed in the light-emitting device 3 according to Comparative Example 5 at the beginning of electrical conduction, and increased by 25 times after the temperature cycle test as many as those at the beginning of electrical conduction. The difference in the results may be resulted from the fact that the thickness of the first layer formed by a mixture of a molybdenum oxide and α-NPD is increased.

The result from Example 9 shows that the number of dark pixel defects can be drastically reduced by increasing the thickness of a light-emitting element. According to the result from Example 8, it is clear that a driving voltage is not increased with increasing the thickness of a light-emitting element. Therefore, a light-emitting device with a low driving voltage and with drastically inhibited dark pixel defects can be provided according to the present invention.

EXAMPLE 10

Characteristics of a film formed by a molybdenum oxide that is a metal oxide, a film formed by α-NPD that is an organic compound with high hole transporting properties, and a film formed by a mixture of a molybdenum oxide and α-NPD are examined. These films are formed by vapor deposition.

As illustrated in Table 3, the ionization potential of the film formed by a mixture of a molybdenum oxide and α-NPD is approximately 0.1 to 0.2 eV less than that of the film formed by a molybdenum oxide and the film formed by α-NPD. Consequently, hole injection properties of the film formed by a mixture of a molybdenum oxide and α-NPD are improved.

TABLE 3

| Material of Film | IP$^b$ (eV) |
|---|---|
| MoO$_3$ | −5.48 |
| NPB | −5.38 |
| MoO$_3$-NPB (1:1)$^a$ | −5.37 |
| MoO$_3$-NPB (1:0.5)$^a$ | −5.27 |

$^a$mol/mol.
$^b$Ionization Potential (Surveyed Value by AC-2)

Figure 16:
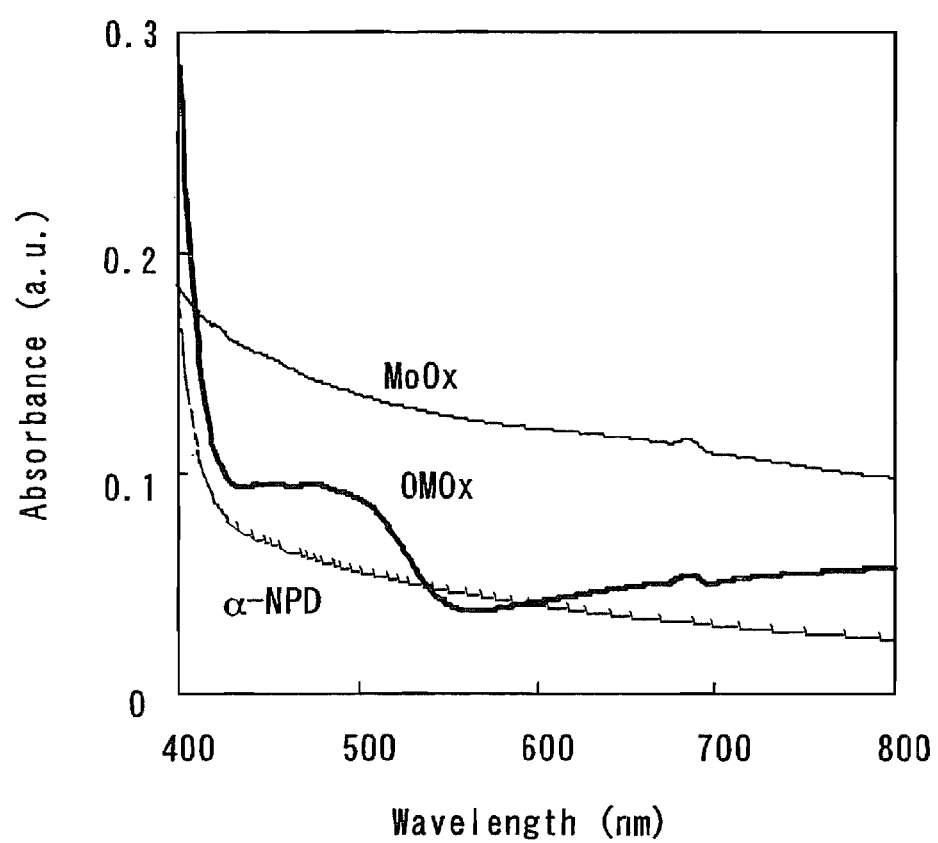
FIG. 16 is a graph for showing absorption characteristics of light-emitting element according certain aspects of the present invention.

FIG. 16 shows absorption spectra of these films. In the absorption spectra, the spectra of the film of a molybdenum oxide and the film of α-NPD have no characteristic peak in a visible light region. On the other hand, the absorption of the film formed by a mixture of a molybdenum oxide and α-NPD (OMOx) is less than that of the film formed by a molybdenum oxide. Hence, absorption loss of light can be reduced by using a layer formed by a mixture of a molybdenum oxide and α-NPD rather than using a layer formed by a molybdenum oxide.

In FIG. 16, the spectrum of the film formed by a mixture of a molybdenum oxide and α-NPD has newly an absorption peak at around 500 nm. The absorption peak may be resulted from the formation of a charge-transfer complex between the molybdenum oxide and the α-NPD in the film. The molybdenum oxide is an acceptor, while the α-NPD is a donor. Further, it has been confirmed that not only α-NPD but also an amine-based compound such as DNTPD serves as a donor.

As described in Example 1 or 2, the lifetime can be extended of a light-emitting element that includes a layer containing a compound selected from the group of metal oxides and a compound having high hole transporting properties since the crystallization of the layer can be suppressed. As mentioned above, the mixing of an inorganic material and an organic material can generate a synergistic effect that cannot be obtained by using these materials separately.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A lighting system installed with a light-emitting device comprising:
   a first electrode;
   a first layer over the first electrode; and
   a second electrode over the first layer,
   wherein the first layer comprises:
      a compound selected from the group consisting of oxide semiconductor and a metal oxide; and
      an organic compound.

2. The lighting system according to claim 1, wherein the compound is selected from molybdenum oxide, vanadium oxide, ruthenium oxide, and tungsten oxide.

3. The lighting system according to claim 1, wherein the compound is molybdenum oxide.

4. The lighting system according to claim 1, wherein the organic compound is an aromatic amine.

5. The lighting system according to claim 1, wherein the first layer is in contact with the first electrode.

6. The lighting system according to claim 1, wherein the first electrode is a cathode.

7. A light-emitting element comprising:
   a first electrode;
   a first layer over the first electrode, the first layer comprising:
      a compound selected from the group consisting of oxide semiconductor and a metal oxide; and
      an organic compound;
   a light-emitting layer over the first layer, the light-emitting layer comprising a light-emitting compound; and
   a second electrode over the light-emitting layer,
   wherein a hole transportation property of the organic compound is higher than an electron transportation property of the organic compound, and
   wherein the organic compound and the compound are capable of forming a charge-transfer complex in the first layer.

8. The light-emitting element according to claim 7, wherein the first electrode is an anode, and
   wherein the first layer is in contact with the first electrode.

9. The light-emitting element according to claim 7, wherein the compound is selected from molybdenum oxide, vanadium oxide, ruthenium oxide, and tungsten oxide.

10. The light-emitting element according to claim 7, wherein the compound is molybdenum oxide.

11. The light-emitting element according to claim 7, wherein the organic compound is an aromatic amine.

12. A lighting system installed with a light-emitting device comprising:
    a first electrode;
    a first layer over the first electrode, the first layer comprising:
       a compound selected from the group consisting of oxide semiconductor and a metal oxide; and
       an organic compound;
    a light-emitting layer over the first layer, the light-emitting layer comprising a light-emitting compound; and
    a second electrode over the light-emitting layer,
    wherein a hole transportation property of the organic compound is higher than an electron transportation property of the organic compound, and
    wherein the organic compound and the compound are capable of forming a charge-transfer complex in the first layer.

13. The lighting system according to claim 12,
    wherein the first electrode is an anode, and
    wherein the first layer is in contact with the first electrode.

14. The lighting system according to claim 12, wherein the compound is selected from molybdenum oxide, vanadium oxide, ruthenium oxide, and tungsten oxide.

15. The lighting system according to claim 12, wherein the compound is molybdenum oxide.

16. The lighting system according to claim 12, wherein the organic compound is an aromatic amine.

* * * * *

UNITED STATES PATENT AND TRADEMARK OFFICE
CERTIFICATE OF CORRECTION

PATENT NO. : 8,507,903 B2  Page 1 of 1
APPLICATION NO. : 13/478547
DATED : August 13, 2013
INVENTOR(S) : Hisao Ikeda et al.

It is certified that error appears in the above-identified patent and that said Letters Patent is hereby corrected as shown below:

In the Specification

At column 2, line 51, "coupound" should be --compound--;dddddddd

At column 4, line 19, "(UN)" should be --(TiN)--;

At column 4, lines 31-32, "4,4'-bis[N-(1-naphthyl)-N-phenyl-aminol-biphenyl" should be --4,4'-bis[N-(1-naphthyl)-N-phenyl-amino]-biphenyl--;

At column 4, lines 55-56, "compound selected from oxide semiconductor and a metal oxide, and a" should be --compound selected from oxide semiconductor and a metal oxide, and a compound having high hole transportation properties. As the compound having a high--;

At column 4, line 58, "(phenyl)antracene" should be --(phenyl)anthracene--.

At column 5, line 43, "election" should be --electron--;

At column 7, line 60, "thickness of 37.5 mm" should be --thickness of 37.5 nm--; and At column 9, line 3, "with the TTO" should be --with the ITO--; and At column 13, line 8, "thickness of 375 nm" should be --thickness of 37.5 nm--.

Signed and Sealed this
Twenty-eighth Day of January, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,507,903 B2  
APPLICATION NO. : 13/478547  
DATED : August 13, 2013  
INVENTOR(S) : Hisao Ikeda et al.

Page 1 of 1

It is certified that error appears in the above-identified patent and that said Letters Patent is hereby corrected as shown below:

In the Specification

At column 2, line 51, "coupound" should be --compound--;

At column 4, line 19, "(UN)" should be --(TiN)--;

At column 4, lines 31-32, "4,4'-bis[N-(1-naphthyl)-N-phenyl-aminol-biphenyl" should be --4,4'-bis[N-(1-naphthyl)-N-phenyl-amino]-biphenyl--;

At column 4, lines 55-56, "compound selected from oxide semiconductor and a metal oxide, and a" should be --compound selected from oxide semiconductor and a metal oxide, and a compound having high hole transportation properties. As the compound having a high--;

At column 4, line 58, "(phenyl)antracene" should be --(phenyl)anthracene--;

At column 5, line 43, "election" should be --electron--;

At column 7, line 60, "thickness of 37.5 mm" should be --thickness of 37.5 nm--; and At column 9, line 3, "with the TTO" should be --with the ITO--; and At column 13, line 8, "thickness of 375 nm" should be --thickness of 37.5 nm--.

This certificate supersedes the Certificate of Correction issued January 28, 2014.

Signed and Sealed this  
Ninth Day of September, 2014

Michelle K. Lee  
*Deputy Director of the United States Patent and Trademark Office*